US012777920B2

(12) United States Patent
Jeng et al.

(10) Patent No.: US 12,777,920 B2
(45) Date of Patent: Oct. 27, 2026

(54) SEMICONDUCTOR DEVICES WITH INTEGRATED PASSIVE DEVICES AND METHODS OF MANUFACTURE

(71) Applicant: Taiwan Semiconductor Manufacturing Co., Ltd., Hsinchu (TW)

(72) Inventors: Shin-Puu Jeng, Po-Shan Village (TW); Po-Yao Chuang, Hsinchu (TW); Shuo-Mao Chen, New Taipei City (TW); Feng-Cheng Hsu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/873,387

(22) Filed: Jul. 26, 2022

(65) Prior Publication Data

US 2022/0359410 A1 Nov. 10, 2022

Related U.S. Application Data

(62) Division of application No. 16/900,174, filed on Jun. 12, 2020.

(Continued)

(51) Int. Cl.

| | |
|---|---|
| *H10W 20/44* | (2026.01) |
| *H10W 20/00* | (2026.01) |
| *H10W 20/40* | (2026.01) |
| *H10W 20/42* | (2026.01) |
| *H10W 72/20* | (2026.01) |
| *H10W 74/01* | (2026.01) |
| *H10W 74/10* | (2026.01) |

(52) U.S. Cl.

CPC ..... *H10W 20/4421* (2026.01); *H10W 20/056* (2026.01); *H10W 20/081* (2026.01); *H10W 20/42* (2026.01); *H10W 20/496* (2026.01); *H10W 72/20* (2026.01); *H10W 74/01* (2026.01); *H10W 74/10* (2026.01)

(58) Field of Classification Search

CPC . H01L 21/56; H01L 23/5223; H01L 25/0657; H01L 23/49816; H01L 28/40; H01G 4/30; H01G 4/38

See application file for complete search history.

(56) References Cited

U.S. PATENT DOCUMENTS

| | | | |
|---|---|---|---|
| 5,847,936 | A | 12/1998 | Forehand et al. |
| 9,035,457 | B2 | 5/2015 | Lin et al. |

(Continued)

FOREIGN PATENT DOCUMENTS

| | | | | |
|---|---|---|---|---|
| CN | 106653705 | A | 5/2017 | |
| KR | 20170094484 | A * | 8/2017 | ............ H10W 90/00 |
| TW | 201724363 | A | 7/2017 | |

*Primary Examiner* — Sue A Purvis

(74) *Attorney, Agent, or Firm* — Slater Matsil, LLP

(57) ABSTRACT

Semiconductor devices and methods of manufacture are provided wherein multiple integrated passive devices are integrated together utilizing an integrated fan out process in order to form a larger device with a smaller footprint. In particular embodiments the multiple integrated passive devices are capacitors which, once stacked together, can be utilized to provide a larger overall capacitance than any single passive device can obtain with a similar footprint.

20 Claims, 18 Drawing Sheets

Related U.S. Application Data

(60) Provisional application No. 62/939,147, filed on Nov. 22, 2019.

(56) References Cited

U.S. PATENT DOCUMENTS

| | | | | |
|---|---|---|---|---|
| 12,002,767 | B2 * | 6/2024 | Liu | H10P 54/00 |
| 12,021,053 | B2 * | 6/2024 | Wu | H05K 1/181 |
| 12,224,266 | B2 * | 2/2025 | Jeng | H01G 2/06 |
| 12,368,077 | B2 * | 7/2025 | Wu | H10P 72/74 |
| 2008/0315377 | A1 | 12/2008 | Eichelberger et al. | |
| 2011/0007489 | A1 | 1/2011 | Ohigashi et al. | |
| 2012/0056312 | A1 * | 3/2012 | Pagaila | H01L 23/3128 257/E23.116 |
| 2013/0307140 | A1 | 11/2013 | Huang et al. | |
| 2014/0124919 | A1 | 5/2014 | Huang et al. | |
| 2016/0343685 | A1 | 11/2016 | Lin et al. | |
| 2017/0033135 | A1 | 2/2017 | Whitefield et al. | |
| 2017/0098629 | A1 | 4/2017 | Liu et al. | |
| 2017/0162524 | A1 * | 6/2017 | Wang | H01L 23/66 |
| 2017/0229322 | A1 * | 8/2017 | Hsu | H01L 24/83 |
| 2018/0025992 | A1 | 1/2018 | Hung et al. | |
| 2018/0330966 | A1 | 11/2018 | Scanlan et al. | |
| 2018/0358298 | A1 * | 12/2018 | Zhai | H10P 72/74 |
| 2018/0374821 | A1 * | 12/2018 | Chen | H10W 72/012 |
| 2019/0088595 | A1 | 3/2019 | Yu et al. | |
| 2019/0115300 | A1 | 4/2019 | Yu et al. | |
| 2019/0131273 | A1 | 5/2019 | Chen et al. | |
| 2019/0148347 | A1 | 5/2019 | Jeng et al. | |
| 2019/0318975 | A1 | 10/2019 | Shi et al. | |
| 2019/0385941 | A1 * | 12/2019 | Lai | H01L 23/49827 |
| 2020/0312766 | A1 * | 10/2020 | Bhagavat | H01L 21/6836 |
| 2020/0381404 | A1 | 12/2020 | Mok et al. | |
| 2021/0118806 | A1 * | 4/2021 | Tai | H01L 25/18 |
| 2021/0183794 | A1 * | 6/2021 | Tang | H01F 17/0033 |

* cited by examiner

Equivalent Circuit Design: $C_t = C_a + C_b + C_c$

SEMICONDUCTOR DEVICES WITH INTEGRATED PASSIVE DEVICES AND METHODS OF MANUFACTURE

PRIORITY CLAIM AND CROSS-REFERENCE

This application is a division of U.S. patent application Ser. No. 16/900,174, filed on Jun. 12, 2020, entitled "Semiconductor Devices," which claims the benefit of U.S. Provisional Application No. 62/939,147, filed on Nov. 22, 2019, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
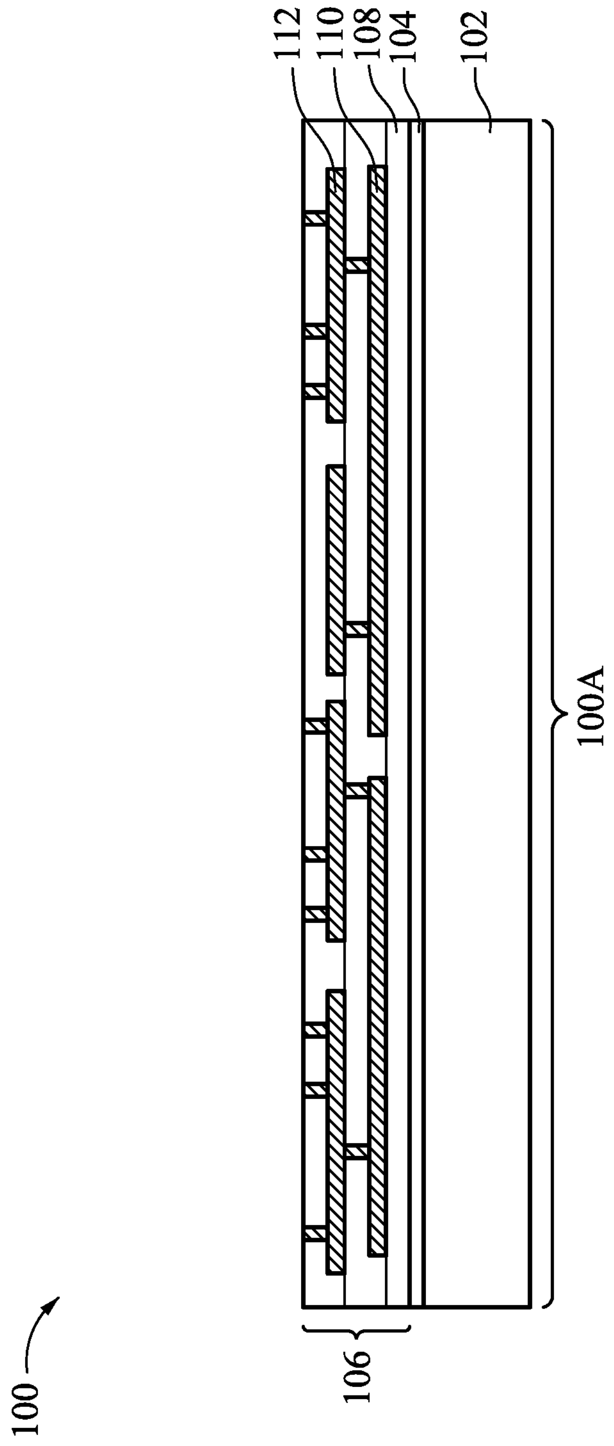
FIG. 1 illustrates formation of a redistribution structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-5 illustrate cross-sectional views of intermediate steps during a process for forming a first integrated passive device (IPD) stack 500 (not illustrated in full in FIG. 1 but illustrated in FIG. 5A), in accordance with some embodiments. A first package region 100A is illustrated which may be adjacent to a second package region (not separately illustrated), and one or more of first IPD dies 50A are packaged to form an integrated circuit package in each of the package regions (e.g., the first package region 100A and the second package region). The integrated circuit packages may also be referred to as integrated fan-out (InFO) packages.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures (e.g., back-side redistribution structure 106) that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

FIG. 1 also illustrates that a back-side redistribution structure 106 may be formed on the release layer 104. In the embodiment shown, the back-side redistribution structure 106 includes a dielectric layer 108, one or more metallization patterns 110 (sometimes referred to as redistribution layers or redistribution lines), and one or more dielectric layers 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, CVD, laminating, the like, or a combination thereof.

The metallization pattern 110 may be formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photosensitive material, the dielectric layer 112 can be developed after the exposure.

It should be appreciated that the back-side redistribution structure 106 may include any number of dielectric layers and metallization patterns, such as one or more layers of dielectric layers and metallization patterns. If more dielectric layers and metallization patterns are to be formed, steps and processes discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 2A:
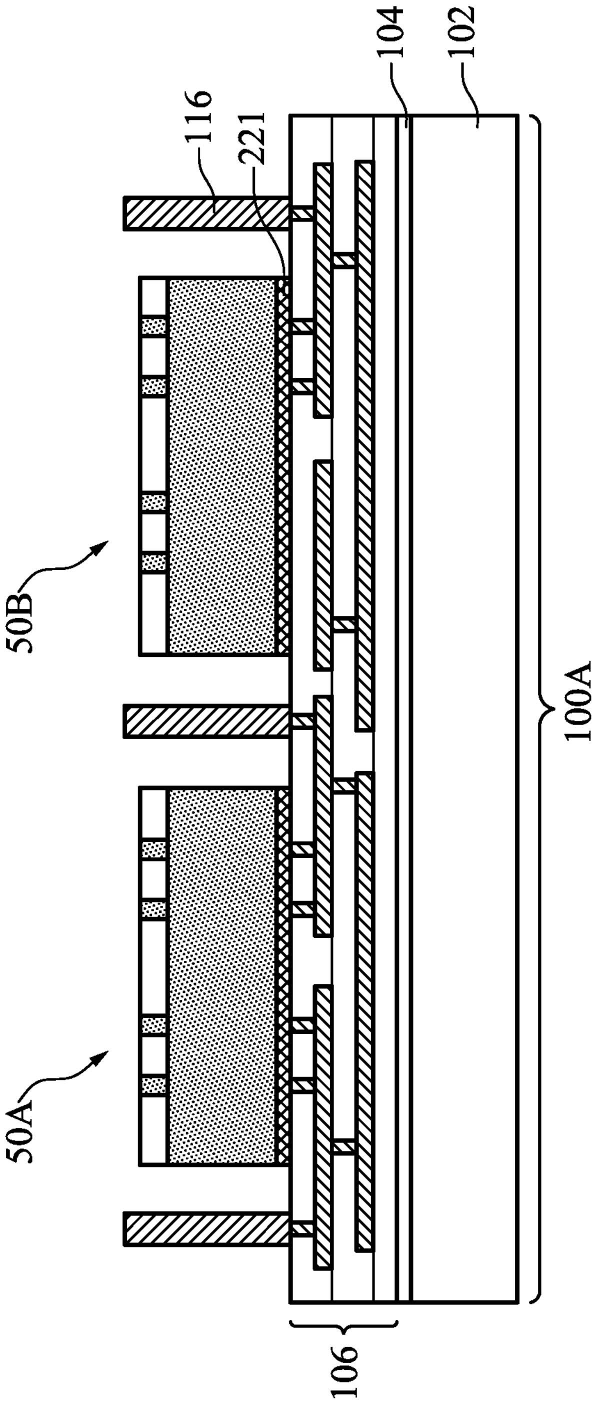
FIGS. 2A-2C illustrate placement of a first integrated passive device, in accordance with some embodiments.

In FIG. 2A, first through vias 116 are formed in the openings and extending away from the topmost dielectric layer of the back-side redistribution structure 106 (e.g., the dielectric layer 112). As an example to form the first through vias 116, a seed layer (not shown) is formed over the back-side redistribution structure 106, e.g., on the dielectric layer 112 and portions of the metallization pattern 110 exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the first through vias 116.

FIG. 2A additionally illustrates that one or more or two or more IPD dies 50 are adhered to the dielectric layer 112 by an adhesive 221 using, e.g., a pick-and-place process. A desired type and quantity of IPD dies 50 are adhered in each of the package regions (e.g., the first package region 100A). In the embodiment shown, multiple IPD dies 50 are adhered adjacent one another, including a first IPD die 50A and a second IPD die 50B. The first IPD die 50A and the second IPD die 50B may be dies which includes passive components, such as deep trench capacitors (with, e.g., MOM or MIM capacitors), multi-layer ceramic capacitors (MLCCs), coil inductors, film resistors, microstriplines, impedance matching elements, balums, combinations of these, or the like.

Figure 2B:
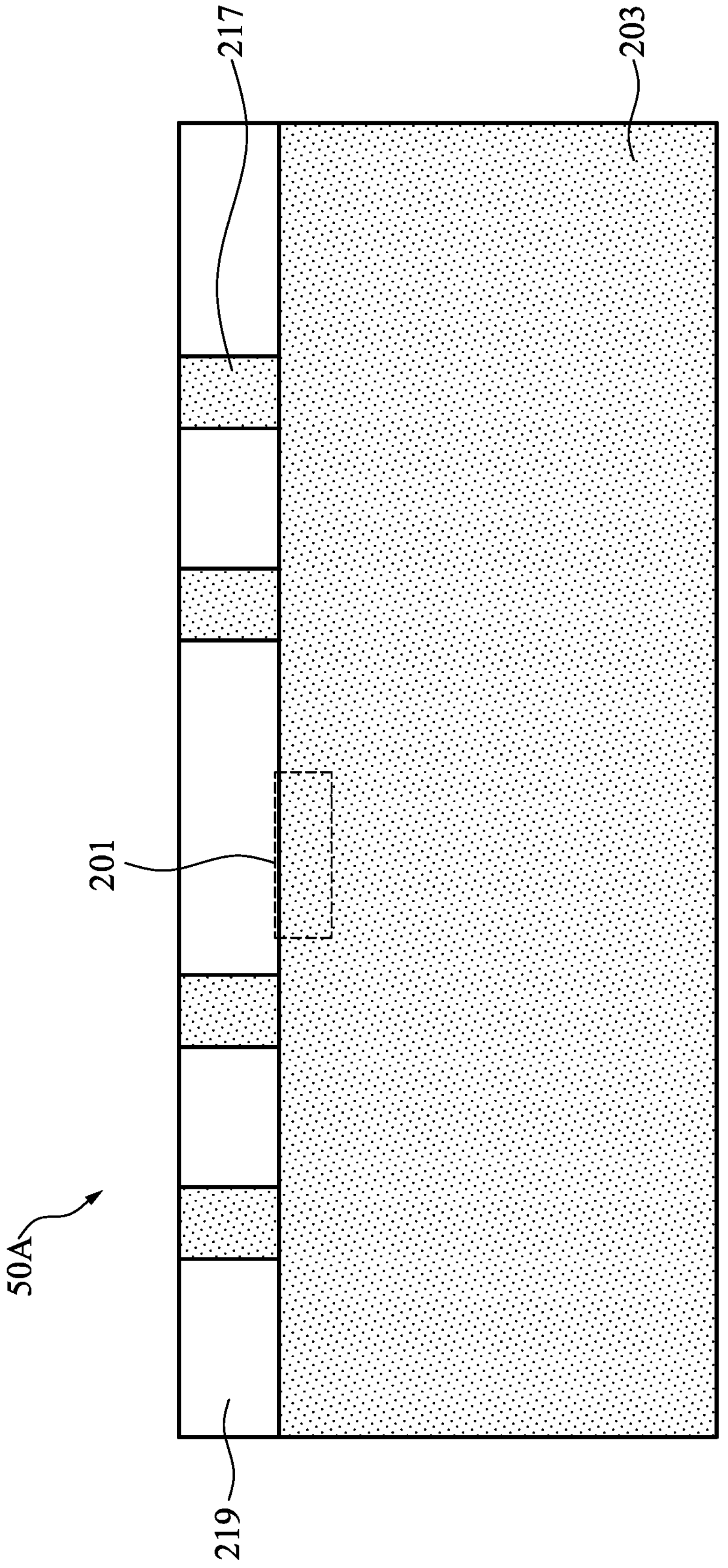
Figure 2C:
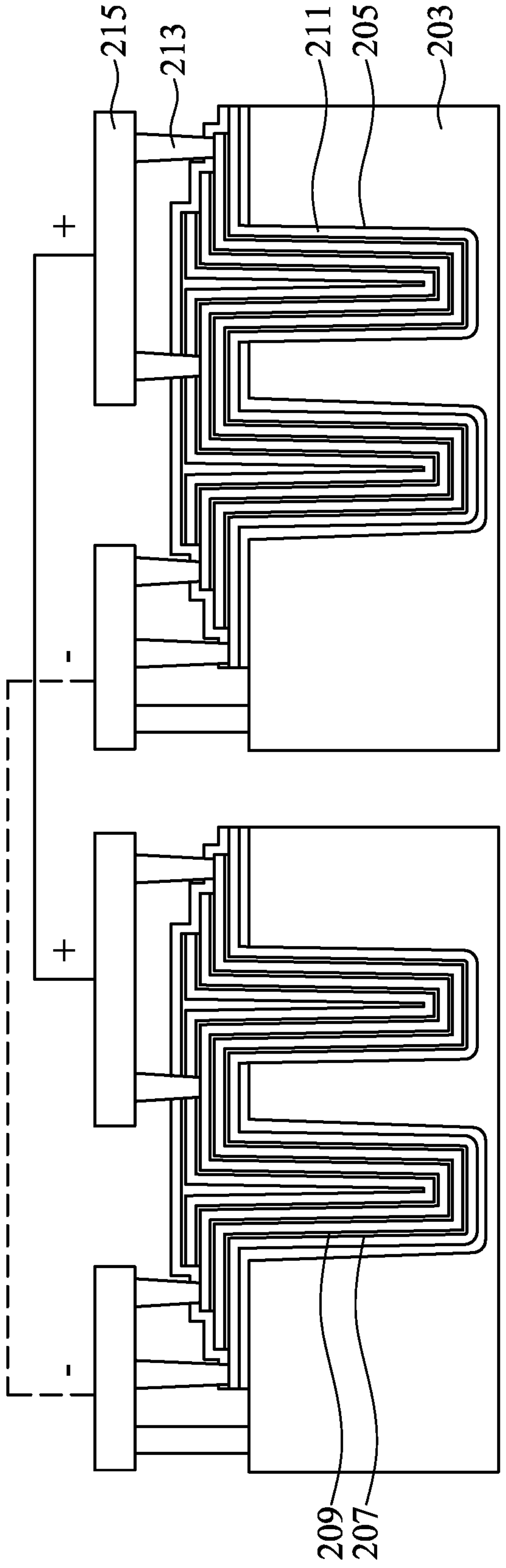

FIGS. 2B-2C illustrate closer views of the first IPD die 50A, with FIG. 2C illustrating a close-up view of the dashed box 201 in FIG. 2B. As can be seen in FIG. 2C, in an embodiment in which the first IPD die 50A is a deep trench capacitor die, the first IPD die 50A may comprise a second substrate 203 and openings 205 filled with multiple layers of a conductive material 207 alternated with layers of a dielectric material 209. The first IPD die 50A may include more than one deep trench capacitor interconnected in a parallel arrangement, and each deep trench capacitor includes two openings 205 filled with the conductive material 207 and the dielectric material 209. The second substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Openings 205 are formed within the second substrate 203 to accommodate the formation of deep trench capacitors using the conductive material 207 and the dielectric material 209. In an embodiment the openings 205 may be formed using one or more photolithographic masking and etching processes, such as the use of a photomask followed by an anisotropic etching process to remove portions of the second substrate 203. However, any suitable process may be utilized.

Once the openings 205 have been formed, a liner 211 may be deposited to line the openings 205, followed by a series of alternating layers of conductive material 207 and dielectric material 209. In an embodiment the liner 211 may be a dielectric material such as silicon oxide, the conductive material 207 may be a conductive material such as titanium nitride, and the dielectric material 209 may be one or more layers of high-k dielectric materials, such as zirconium oxide, aluminum oxide, hafnium oxide, combinations of these, or the like. Each layer may be deposited using a deposition process such as chemical vapor deposition, physical vapor deposition, atomic layer deposition, combinations of these, or the like, until there are four layers of the conductive material 207 and four layers of the dielectric material 209. However, any suitable materials, processes, and number of alternating layers may be utilized.

Once the layers of the conductive material 207 and the layers of the dielectric material 209 have been formed, the layers may be patterned (e.g., through one or more photolithographic masking and etching processes), a contact etch stop layer may be deposited, and contacts 213 to overlying metallization layers 215 may be formed. In an embodiment the contacts 213 and the overlying metallization layers 215 may be formed using damascene or dual damascene processes, such as by initially depositing a dielectric layer (not separately illustrated), patterning the dielectric layer to expose the underlying conductive material, overfilling the openings with another conductive material, and planarizing the conductive material to form the contacts 213 and the metallization layers 215. However, any suitable methods may be utilized to form the contacts 213 and the metallization layers 215.

Returning now to FIG. 2B, once the desired numbers of metallization layers 215 have been formed, external die contacts 217 may be formed to provide external connections to the internally formed capacitors. In an embodiment the external die contacts 217 may be a conductive pillar, such as a copper pillar, and may comprise one or more conductive materials, such as copper, tungsten, other conductive metals, or the like, and may be formed, for example, by electroplating, electroless plating, or the like with a seed layer and a placed and patterned photoresist. In an embodiment, an electroplating process is used wherein the seed layer and the photoresist are submerged or immersed in an electroplating solution such as a copper sulfate ($CuSO_4$) containing solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist. Once formed, the photoresist may be removed and the underlying exposed seed layer may be removed.

In another embodiment, the external die contacts 217 may be contact bumps such as microbumps or controlled collapse chip connection (C4) bumps and may comprise a material such as tin, or other suitable materials, such as silver or copper. In an embodiment in which the external die contacts 217 are contact bumps, the external die contacts 217 may comprise a material such as tin, or other suitable materials, such as silver, lead-free tin, or copper. In an embodiment in which the external die contacts 217 is a tin solder bump, the external die contacts 217 may be formed by initially forming a layer of tin through such commonly used methods such as evaporation, electroplating, printing, solder transfer, ball placement, etc, to a thickness of, e.g., about 100 μm. Once a layer of tin has been formed on the structure, a reflow may be performed in order to shape the material into the desired bump shape.

Once the external die contacts 217 have been formed, a passivation layer 219 may be formed over the external die contacts 217. In an embodiment the passivation layer 219 may be polybenzoxazole (PBO), although any suitable material, such as polyimide or a polyimide derivative, may be utilized. The passivation layer 219 may be placed using, e.g., a spin-coating process to a thickness of between about 5 μm and about 25 μm, such as about 7 μm, although any suitable method and thickness may be used. Once in place, the passivation layer 219 may be planarized with the external die contacts 217 using, e.g., a chemical mechanical polishing process.

Additionally, while a process has been described whereby the external die contacts 217 are formed and then surrounded by the passivation layer 219, this order is intended to be illustrative and is not intended to be limiting. Rather, any suitable order of process steps, such as depositing the passivation layer 219 first, patterning the passivation layer 219 to form openings for the external die contacts 217, and then forming the external die contacts 217 within the openings, may be also be utilized. Any suitable process for forming the external die contacts 217 and the passivation layer 219 may be utilized, and all such processes are fully intended to be included within the scope of the embodiments.

In some embodiments, the first IPD die 50A and second IPD die 50B may be formed in processes of a same technology node, or may be formed in processes of different technology nodes. For example, the first IPD die 50A may be of a more advanced process node than the second IPD die 50B. The first IPD dies 50A and 50B may have different sizes (e.g., different heights and/or surface areas), or may have the same size (e.g., same heights and/or surface areas).

Returning to FIG. 2A, the adhesive 221 is placed on back-sides of the first IPD dies 50A and 50B and adheres the first IPD dies 50A and 50B to the back-side redistribution structure 106, such as to the dielectric layer 112. The adhesive may be any suitable adhesive, epoxy, die attach film (DAF), or the like. The adhesive may be applied to back-sides of the first IPD dies 50A and 50B or may be applied over the surface of the carrier substrate 102. For example, the adhesive may be applied to the back-sides of the first IPD dies 50A and 50B before singulating to separate the first IPD dies 50A and 50B.

Figure 3:
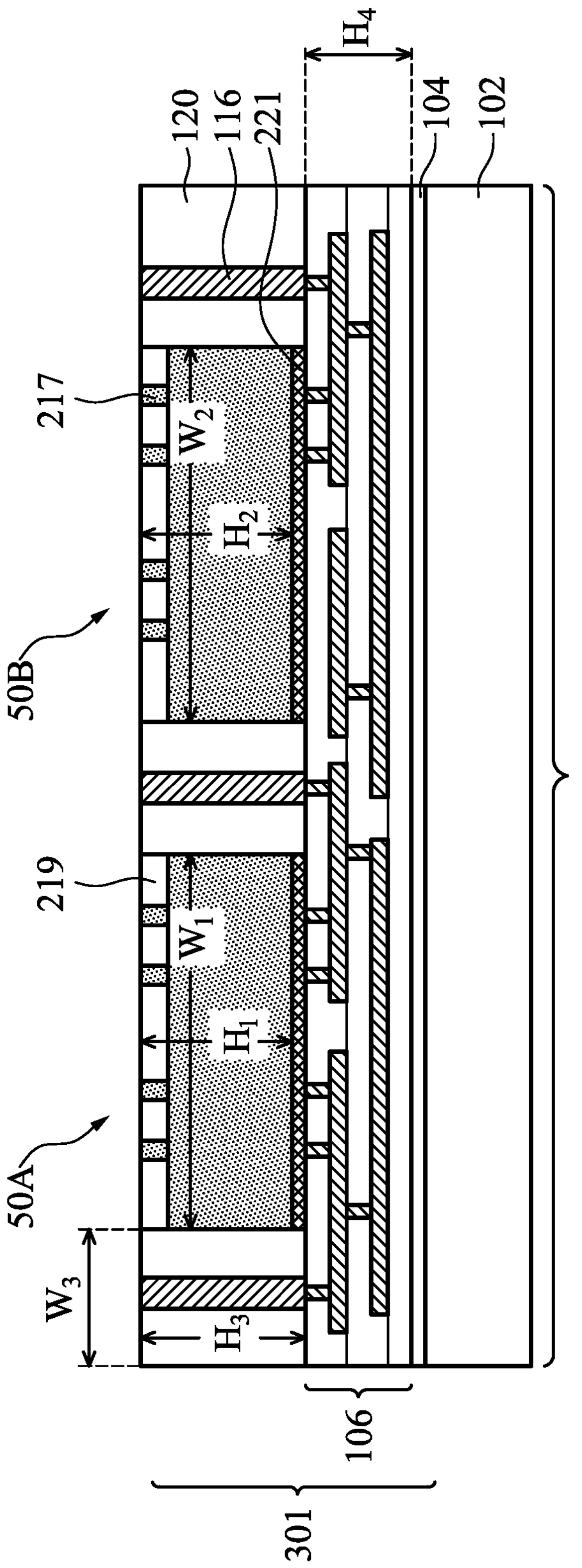
FIG. 3 illustrates an encapsulation of the first integrated passive device, in accordance with some embodiments.

In FIG. 3, an encapsulant 120 is formed on and around the various components to form a first bottom layer 301 of the first IPD stack 500. After formation, the encapsulant 120 encapsulates the first through vias 116 and the first IPD dies 50A and 50B. The encapsulant 120 may be a molding compound, epoxy, or the like. The encapsulant 120 may be applied by compression molding, transfer molding, or the like, and may be formed over the carrier substrate 102 such that the first through vias 116 and/or the first IPD dies 50A and 50B are buried or covered. The encapsulant 120 is further formed in gap regions between the IPD dies 50. The encapsulant 120 may be applied in liquid or semi-liquid form and then subsequently cured.

FIG. 3 also illustrates that a planarization process is performed on the encapsulant 120 to expose the first through vias 116 and the external die contacts 217. The planarization process may also remove material of the first through vias 116, passivation layer 219, and/or external die contacts 217 until the external die contacts 217 and first through vias 116 are exposed. Top surfaces of the first through vias 116, external die contacts 217, passivation layer 219, and encapsulant 120 are coplanar after the planarization process. The planarization process may be, for example, a chemical-mechanical polish (CMP), a grinding process, or the like. In some embodiments, the planarization may be omitted, for example, if the first through vias 116 and/or external die contacts 217 are already exposed.

Once formed, the first bottom layer 301 may have dimensions which help to lower the overall footprint of the first IPD stack 500 while still obtaining an increase in a desired parameter such as capacitance. For example, a first one of the first IPD dies 50A may have a first height $H_1$ of between about 40 μm and about 500 μm, such as about 90 μm, while a second one of the IPD dies 50B may have a second height $H_2$ that may be equal to or different from the first height $H_1$, such as the second height $H_2$ being between about 40 μm and about 500 μm, such as about 90 μm. Similarly, the first one of the IPD dies 50A may have a first width $W_1$ of between about 0.1 mm and about 20 mm, such as about 5 mm, while the second one of the IPD dies 50B may have a second width $W_2$ that may be equal to or different from the first width $W_1$, such as the second width $W_2$ being between about 0.1 mm and about 20 mm, such as about 5 mm. However, any suitable dimensions may be utilized.

Similarly, the encapsulant 120 may have a third height $H_3$ that is larger than the first height $H_1$ and the second height $H_2$, such as by being between about 50 μm and about 700 μm, such as about 100 μm. The back-side redistribution structure 106 may have a fourth height $H_4$ that is less than the third height $H_3$, such as the fourth height $H_4$ being between about 10 μm and about 150 μm, such as about 40 km. However, any suitable heights may be utilized for the encapsulant 120 and the back-side redistribution structure 106.

Finally, the first one of the first IPD dies 50A may be spaced apart from an edge of the encapsulant 120. In an embodiment the first one of the first IPD dies 50A may be spaced apart a third width $W_3$ that is less than the first width $W_1$, such as the third width $W_3$ being between about 50 μm and about 2000 μm, such as about 500 km. However, any suitable dimensions may be utilized.

Figure 4:
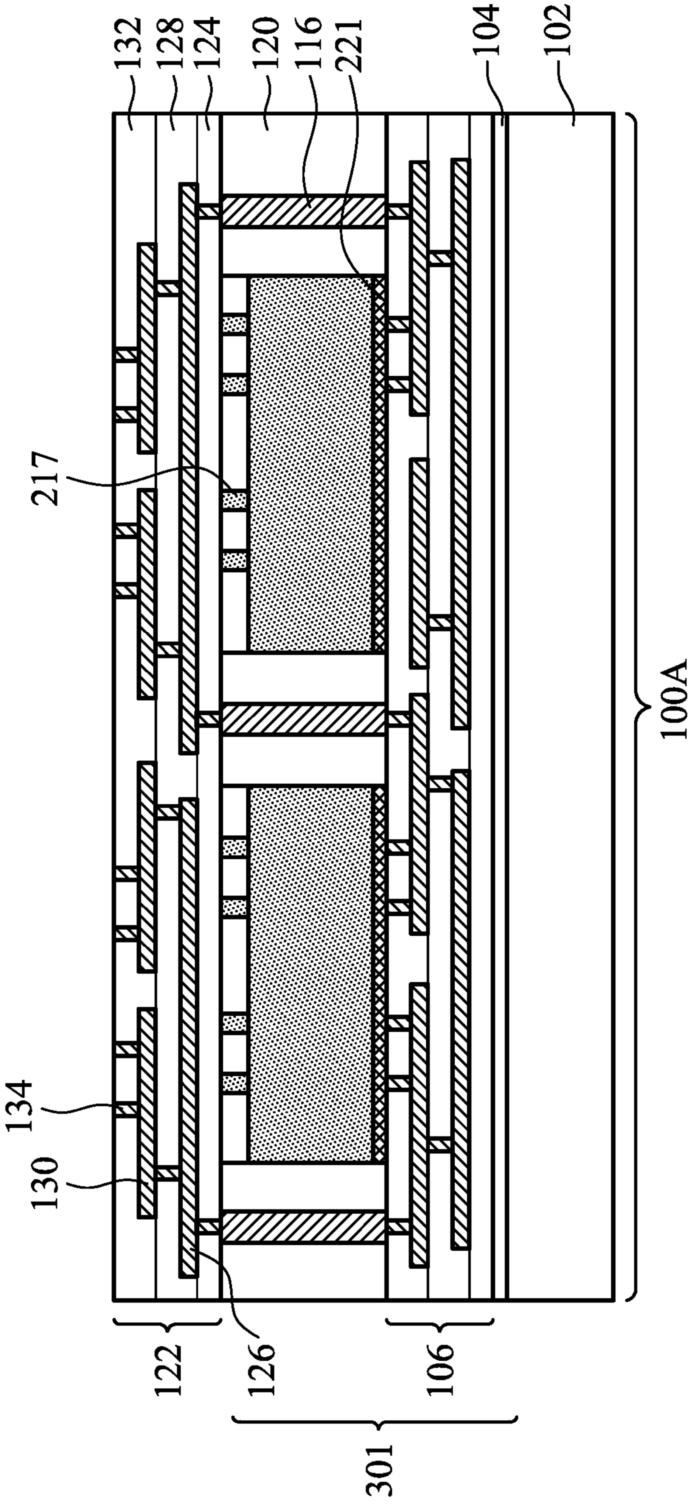
FIG. 4 illustrates formation of another redistribution structure in accordance with some embodiments.

In FIG. 4, a front-side redistribution structure 122 is formed over the encapsulant 120, the first through vias 116, and the first IPD dies 50A and 50B and in electrical connection with the first through vias 116 and the external die contacts 217. The front-side redistribution structure 122 includes dielectric layers 124, 128, and 132; and metallization patterns 126, 130, and 134. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

In an embodiment the dielectric layer 124 is deposited on the encapsulant 120, the first through vias 116, and the external die contacts 217. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the first through vias 116 and the external die contacts 217. The patterning may be by an acceptable process, such as by exposing the dielectric layer 124 to light when the dielectric layer 124 is a photo-sensitive material or by etching using, for example, an anisotropic etch. If the dielectric layer 124 is a photo-sensitive material, the dielectric layer 124 can be developed after the exposure.

The metallization pattern 126 is then formed. The metallization pattern 126 includes line portions (also referred to as conductive lines) on and extending along the major surface of the dielectric layer 124. The metallization pattern 126 further includes via portions (also referred to as conductive vias) extending through the dielectric layer 124 to physically and electrically couple the first through vias 116 and the IPD dies 50. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 128 is deposited on the metallization pattern 126 and dielectric layer 124. The dielectric layer 128 may be formed in a manner similar to the dielectric layer 124, and may be formed of a similar material as the dielectric layer 124. Once formed, the dielectric layer 128 may be patterned in order to expose underlying portions of the metallization pattern 126 using, e.g., a photolithographic masking and etching process. However, any suitable methods and materials may be utilized.

The metallization pattern 130 is then formed. The metallization pattern 130 includes line portions on and extending along the major surface of the dielectric layer 128. The metallization pattern 130 further includes via portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

The dielectric layer 132 is deposited on the metallization pattern 130 and dielectric layer 128. The dielectric layer 132 may be formed in a manner similar to the dielectric layer 124, and may be formed of a similar material as the dielectric layer 124. Once formed, the dielectric layer 132 may be patterned in order to expose underlying portions of the metallization pattern 130 using, e.g., a photolithographic masking and etching process. However, any suitable methods and materials may be utilized.

The metallization pattern 134 is then formed. In the embodiment illustrated the metallization pattern 134 includes only via portions extending through the dielectric layer 132 to physically and electrically couple the metallization pattern 130, although other embodiments may also utilize line portions in addition to the via portions. The metallization pattern 134 may be formed in a similar manner and of a similar material as the metallization pattern 126. However, any suitable methods, such as damascene processes or dual damascene processes, and any suitable materials may be utilized.

The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the first IPD dies 50A and 50B. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 5A:
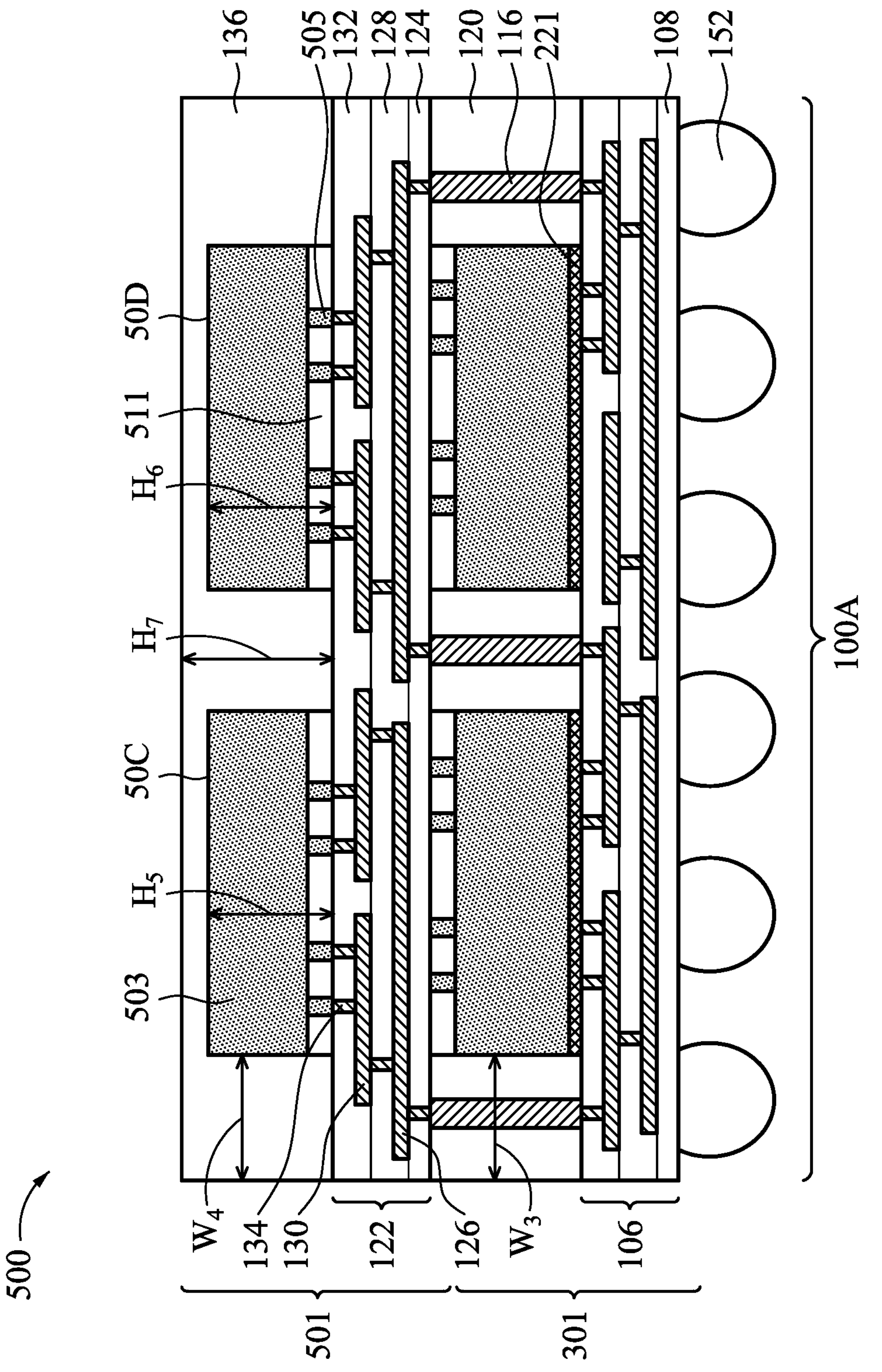
FIGS. 5A-5B illustrate formation of an integrated passive device stack in accordance with some embodiments.

FIG. 5A illustrates placement of second IPD dies 50C and 50D. In an embodiment the second IPD dies 50C and 50D may be similar to the first IPD dies 50A and 50B, and are designed to work in conjunction with the first IPD dies 50A and 50B to provide a more robust functionality than would otherwise be possible in such a small footprint. For example, in embodiments in which the first IPD dies 50A and 50B and the second IPD dies 50C and 50D are capacitor dies such as deep trench capacitor dies, the combination of the first IPD dies 50A and 50B and the second IPD dies 50C and 50D work to provide a larger capacitance in a smaller footprint than a single layer of devices can achieve.

In an embodiment the second IPD dies 50C and 50D may be similar to the first IPD dies 50A and 50B, such as by having a third substrate 503 (similar to the second substrate 203) with deep trench capacitors formed therein and thereon, second external die contacts 505 (similar to the external die contacts 217), and a second passivation layer 511 (similar to the passivation layer 219). However, any suitable structures may be utilized.

In an embodiment the second IPD dies 50C and 50D may be placed into contact with the metallization pattern 134 using, for example, a pick and place process to place the second external die contacts 505 into physical contact with the metallization pattern 134. Once in physical contact, the second IPD dies 50C and 50D may be connected to the metallization pattern 134 using any suitable bonding process, such as fusion bonding, hybrid bonding, metal-to-metal bonding, combinations of these, or the like. However, any suitable bonding process may be utilized.

FIG. 5A also illustrates that an encapsulant 136 is formed on and around the second IPD dies 50C and 50D to form a first top layer 501 of the first IPD stack 500. After formation, the encapsulant 136 encapsulates the second IPD dies 50C and 50D. The encapsulant 136 may be a molding compound, epoxy, or the like. The encapsulant 136 may be applied by compression molding, transfer molding, or the like, and may be formed over the carrier substrate 102 such that the second IPD dies 50C and 50D are buried or covered. The encapsulant 136 is further formed in gap regions between the second IPD dies 50C and 50D. The encapsulant 136 may be applied in liquid or semi-liquid form and then subsequently cured.

In an embodiment the second IPD die 50C may have a fifth height $H_5$ of between about 40 μm and about 500 μm, such as about 90 μm. The second IPD die 50D may have a sixth height $H_6$ that may be the same as, larger than, or less than the fifth height $H_5$, such as the sixth height $H_6$ being between about 40 μm and about 500 μm, such as about 90 km. However, any suitable heights may be utilized.

Additionally, the encapsulant 136 may be formed with a seventh height $H_7$ that is greater than both of the fifth height $H_5$ and the sixth height $H_6$. For example, the encapsulant 136 may be formed to have the seventh height $H_7$ to be between about 50 m and about 700 μm, such as about 100 km. However, any suitable height may be utilized.

Finally, the first one of the second IPD dies 50C may be spaced apart from an edge of the encapsulant 136. In an embodiment the first one of the second IPD dies 50C may be spaced apart a fourth width $W_4$ that is larger than, smaller than, or equal to third width $W_3$ (within the first bottom layer 301), such as the fourth width $W_4$ being between about 50 μm and about 2000 μm, such as about 500 μm. In embodiments in which the fourth width $W_4$ is larger than the third width $W_3$, the structure may be better able to balance warpages throughout the structure. However, in embodiments in which the fourth width $W_4$ is greater than the third width $W_3$, the second IPD dies 50C may be larger, leading to a higher total capacitance. However, any suitable dimensions may be utilized.

FIG. 5A additionally illustrates a carrier substrate de-bonding to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Conductive connectors 152 are formed extending through the dielectric layer 108 to contact the metallization pattern 110. In an embodiment the conductive connectors 152 can be placed by initially forming openings through dielectric layer 108 to expose portions of the metallization pattern 110. The openings may be formed, for example, using laser drilling, etching, or the like. The conductive connectors 152 may be contact bumps such as microbumps or controlled collapse chip connection (C4) bumps and may comprise a material such as tin, or other suitable materials, such as silver or copper. In an embodiment in which the conductive connectors 152 are contact bumps, the conductive connectors 152 may comprise a material such as tin, or other suitable materials, such as silver, lead-free tin, or copper. In an embodiment in which the conductive connectors 152 is a tin solder bump, the conductive connectors 152 may be formed by initially forming a layer of tin through such commonly used methods such as evaporation, electroplating, printing, solder transfer, ball placement, etc, to a thickness of, e.g., about 100 μm. Once a layer of tin has been formed on the structure, a reflow may be performed in order to shape the material into the desired bump shape.

In other embodiments the conductive connectors 152 may be conductive pillars, such as copper pillars, and may comprise one or more conductive materials, such as copper, tungsten, other conductive metals, or the like, and may be formed, for example, by electroplating, electroless plating, or the like with a seed layer and a placed and patterned photoresist. In an embodiment, an electroplating process is used wherein the seed layer and the photoresist are submerged or immersed in an electroplating solution such as a copper sulfate ($CuSO_4$) containing solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist. Once formed, the photoresist may be removed and the underlying exposed seed layer may be removed.

Additionally, the conductive connectors 152 can be arranged in an array of rows and columns along a bottom of the dielectric layer 108. Further, each row may comprise only ground connections while adjacent rows may comprise only power connections. As such, there are parallel lines of ground connections and power connections along the bottom of the dielectric layer 108. However, any suitable arrangement may be utilized.

Once the second IPD dies 50C and 50D have been encapsulated, a singulation process is performed by sawing along scribe line regions, e.g., between the first package region 100A and other package regions in order to form the first IPD stack 500. The resulting, singulated first IPD stack 500 is from the first package region 100A. However, any suitable singulation process may be utilized.

Figure 5B:
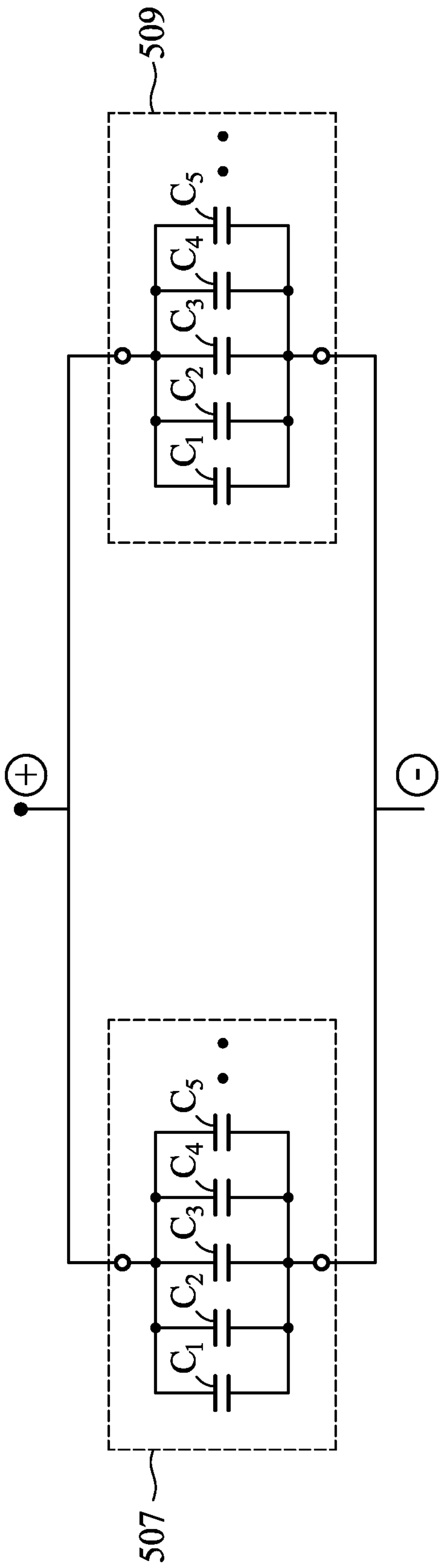

FIG. 5B illustrates an equivalent circuit which represents the equivalent capacitance that can be achieved with the first IPD stack 500. In this embodiment, the capacitance ($C_a$) that is obtainable from the first bottom layer 301 is represented in the dashed box 507 (wherein the individual capacitances of the individual capacitors are labeled $C_1$, $C_2$, etc. . . . ) while the capacitance ($C_b$) that is obtainable from the first top layer 501 is represented in the dashed box 509 (wherein the individual capacitances of the individual capacitors are labeled $C_1$, $C_2$, etc. . . . ). As can be seen, by stacking and interconnecting the capacitors in each of the IPD dies (e.g., the first IPD dies 50A and 50B and the second IPD dies 50C and 50D), the IPD dies can be interconnected in a parallel arrangement. As such, the total capacitance ($C_T$) for the first IPD stack 500 can be the sum of the capacitance ($C_a$) that is obtainable from the first bottom layer 301 and the capacitance ($C_b$) that is obtainable from the first top layer 501 (e.g., $C_T=C_a+C_b$). As such, a larger capacitance can be obtained without increasing the overall footprint.

Figure 6:
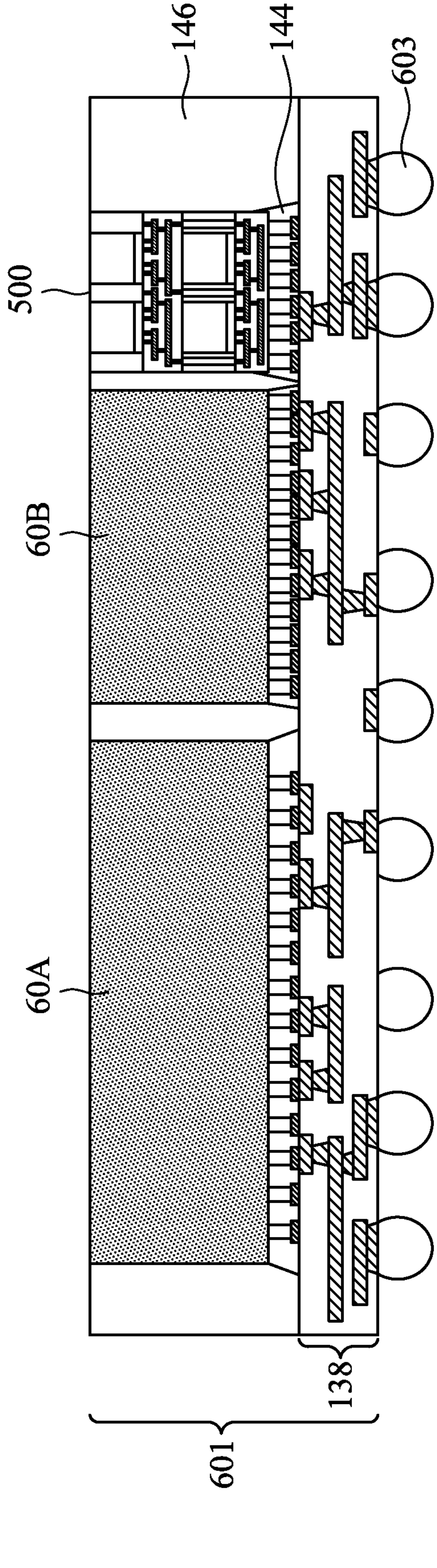
FIG. 6 illustrates placement of the integrated passive device stack on another redistribution structure in accordance with some embodiments.

FIG. 6 illustrates a placement of the first IPD stack 500 onto a third redistribution structure 138. In an embodiment the third redistribution structure 138 may be formed similar to the back-side redistribution structure 106. For example, the third redistribution structure 138 may be formed on a carrier substrate (not separately illustrated), and then one or more sides of the third redistribution structure 138 may be exposed in order to provide locations for further bonding. However, any suitable processes and materials may be utilized to form the third redistribution structure 138.

Once the third redistribution structure 138 has been formed, the first IPD stack 500 may be attached to the third redistribution structure 138. In an embodiment the first IPD stack 500 may be placed into contact with the third redistribution structure 138 using, for example, a pick and place process. Once in physical contact, the first IPD stack 500 may be bonded to the third redistribution structure 138 using any suitable bonding process, such as a reflow process, a fusion bonding process, a hybrid bonding process, a metal-to-metal bonding process, combinations of these, or the like.

FIG. 6 also illustrates that, in addition to the first IPD stack 500, a first functional die 60A and a second functional die 60B are also bonded to the third redistribution structure 138. In an embodiment the first functional die 60A may be a logic device, such as a system-on-a-chip (SoC), a central processing unit (CPU), a graphics processing unit (GPU), a microcontroller, or the like. The second functional die 60B may be a memory device, such as a high bandwidth memory (HBM) module, a dynamic random access memory (DRAM) die, static random access memory (SRAM) die, hybrid memory cube (HMC) module, or the like. In some embodiments, the first functional die 60A may be an SoC die and the second functional die 60B may be a high bandwidth memory. The first functional die 60A and the second functional die 60B may be formed in processes of a same technology node, or may be formed in processes of different technology nodes. For example, the first functional die 60A may be of a more advanced process node than the second functional die 60B. The first functional die 60A and the second functional die 60B may have different sizes (e.g., different heights and/or surface areas), or may have the same size (e.g., same heights and/or surface areas).

In an embodiment the first functional die 60A and the second functional die 60B may be placed into contact with the third redistribution structure 138 using, for example, a pick and place process, whereby external contacts (similar in some embodiments to conductive connectors 152) are placed in physical contact with conductive portions of the third redistribution structure 138. Once in physical contact, the first functional die 60A and the second functional die 60B may be bonded to the third redistribution structure 138 using any suitable bonding process, such as a reflow process, a fusion bonding process, a hybrid bonding process, a metal-to-metal bonding process, combinations of these, or the like.

In some embodiments, an underfill 144 is formed between the third redistribution structure 138 and the first functional die 60A, between the third redistribution structure 138 and the second functional die 60B, and between the third redistribution structure 138 and the first IPD stack 500. The underfill 144 may reduce stress and protect the joints resulting from the reflowing of the conductive connectors 152. The underfill 144 may be formed by a capillary flow process after the first functional die 60A, the second functional die 60B, and the first IPD stack 500 are attached, or may be formed by a suitable deposition method before the first functional die 60A, the second functional die 60B, and the first IPD stack 500 are attached.

FIG. 6 also illustrates that an encapsulant 146 is formed on and around the first functional die 60A, the second functional die 60B, and the first IPD stack 500 in order to form a first packaged structure 601. In an embodiment the encapsulant 146 may be a molding compound, epoxy, or the like. The encapsulant 146 may be applied by compression molding, transfer molding, or the like, and may be formed around the first functional die 60A, the second functional die 60B, and the first IPD stack 500 such that the first IPD stack 500, the first functional die 60A and the second functional die 60B are buried or covered. The encapsulant 146 is further formed in gap regions between the first IPD stack 500, the first functional die 60A and the second functional die 60B. The encapsulant 146 may be applied in liquid or semi-liquid form and then subsequently cured.

FIG. 6 also illustrates that a planarization process is performed on the encapsulant 120. The planarization process may also remove material of the first IPD stack 500, the first functional die 60A and the second functional die 60B. Top surfaces of the first IPD stack 500, the first functional die 60A, the second functional die 60B and the encapsulant 120 are coplanar after the planarization process. The planarization process may be, for example, a chemical-mechanical polish (CMP), a grinding process, or the like. In some embodiments, the planarization may be omitted.

Once the encapsulant 146 has been placed, second conductive connectors 603 may be placed or formed on an opposite side of the third redistribution structure 138 from the first IPD stack 500. In an embodiment the second conductive connectors 603 may be similar to the conductive connectors 152, such as by being conductive balls such as solder balls or conductive pillars. However, any suitable materials and methods may be utilized.

Figure 7:
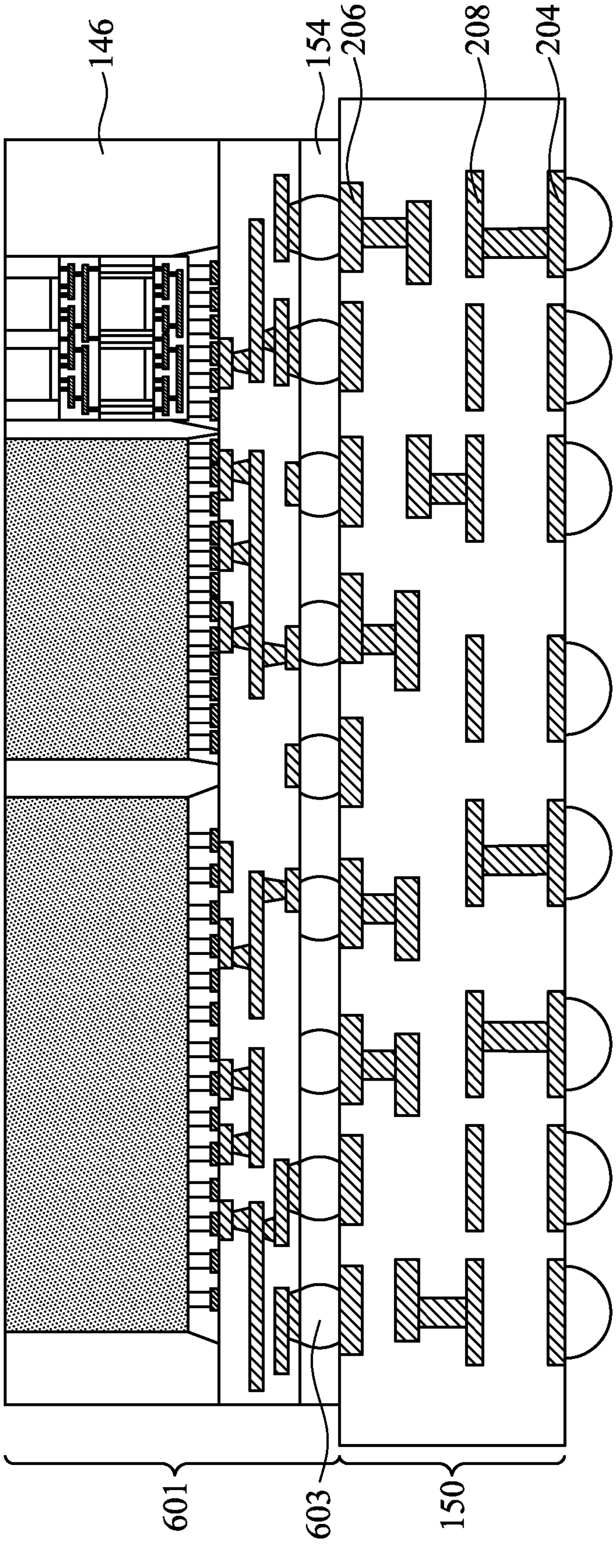
FIG. 7 illustrates a connection of the redistribution structure to a substrate, in accordance with some embodiments.

FIG. 7 illustrates that, once the first IPD stack 500, the first functional die 60A and the second functional die 60B have been encapsulated, the first packaged structure 601 may be attached to a substrate 150. In an embodiment the substrate 150 may comprise an insulating core such as a fiberglass reinforced resin core. One example core material is fiberglass resin such as FR4. In other embodiments the core material includes a bismaleimide-triazine (BT) resin, other printed circuit board (PCB) materials, or films. Build up films such as Ajinomoto build-up film (ABF) or other laminates may also be used for substrate 150.

The substrate 150 may include active and passive devices (not shown). A wide variety of devices such as transistors, capacitors, resistors, combinations of these, and the like may be used to generate the structural and functional requirements of the design. The devices may be formed using any suitable methods.

The substrate 150 may also include metallization layers and conductive vias 208 on either side of the insulating core. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In other embodiments, the substrate 150 is substantially free of active and passive devices.

The substrate 150 may have bond pads 204 on a first side of the substrate 150, and bond pads 206 on a second side of the substrate 150, the second side being opposite the first side of the substrate 150, to couple to the second conductive connectors 603. In some embodiments, the bond pads 204 and 206 are formed by forming recesses (not shown) into dielectric layers (not shown) on the first and second sides of the substrate 150. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In an embodiment, the bond pads 204 and bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application.

In some embodiments, an underfill 154 is formed between the first packaged structure 601 and the substrate 150. The underfill 154 may reduce stress and protect the joints resulting from the reflowing of the second conductive connectors 603. The underfill 154 may be formed by a capillary flow process after the structure is attached, or may be formed by a suitable deposition method before the structure is attached.

In some embodiments, the second conductive connectors 603 are reflowed to attach the first packaged structure 601 to the bond pads 206. The second conductive connectors 603 electrically and/or physically couple the structures, including metallization layers 208 in the substrate 150, to the first packaged structure 601. In some embodiments, a solder resist is formed on the substrate core 302. The first packaged structure 601 may be disposed in openings in the solder resist to be electrically and mechanically coupled to the bond pads 206. The solder resist may be used to protect areas of the substrate 150 from external damage.

By utilizing the first IPD stack 500, an increased capacitance can be attached to the overall structure to work with the first functional die 60A and the second functional die 60B. Additionally, this achievement can be obtained without the need for a larger footprint which would negatively impact the overall size of the device. Finally, by choosing the number and size of the individual IPD dies, a precise capacitance can be obtained without requiring a full redesign of the overall structure.

Figure 8:
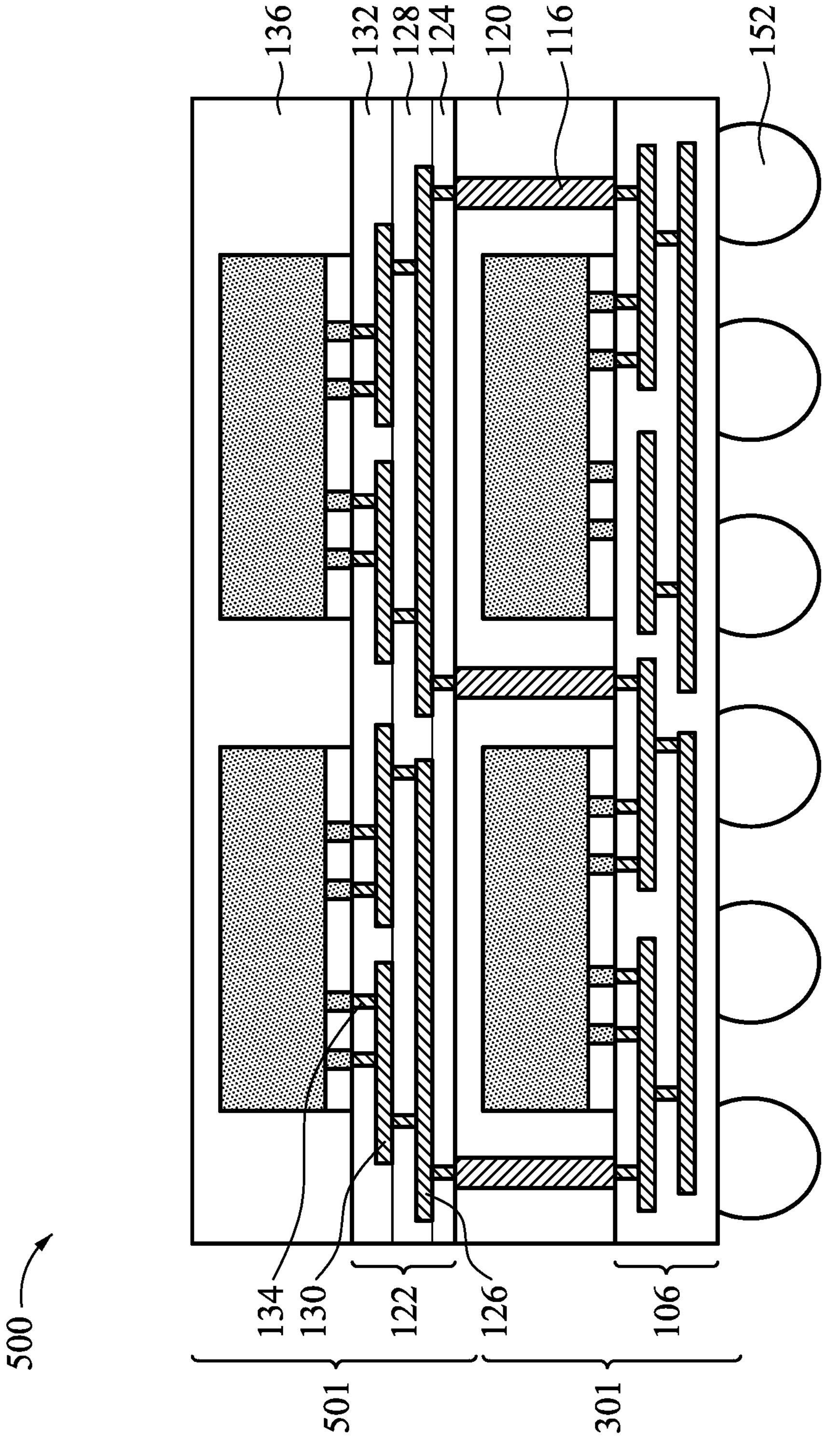
FIG. 8 illustrates the integrated passive device stack using a face to back configuration, in accordance with some embodiments.

FIG. 8 illustrates another embodiment in which the first IPD dies 50A and 50B and the second IPD dies 50C and 50D, instead of being connected in a face-to-face configuration as illustrated above with respect to FIGS. 2-7, are connected in a face-to-back configuration. In particular, in this embodiment the first IPD dies 50A and 50B, instead of being attached to the back-side redistribution structure 106 using an adhesive, are physically and electrically bonded to the back-side redistribution structure 106 prior to the application of the encapsulant 120.

In a particular embodiment the first IPD dies 50A and 50B are bonded to the back-side redistribution structure 106 using the external die contacts 217 and a process similar to the process for bonding the second IPD dies 50C and 50D to the front-side redistribution structure 122 as described above with respect to FIG. 5A. For example, a pick and place process may be utilized to put the first IPD dies 50A and 50B into physical and electrical contact with the back-side redistribution structure 106. Once in physical contact, the first IPD dies 50A and 50B are then bonded using, e.g., a hybrid bonding process, a dielectric bonding process, or any other suitable bonding process. However, any suitable bonding process or other connection process may be utilized.

Once the first IPD dies 50A and 50B are bonded, the process can be continued as described above with respect to FIGS. 3-8. For example, the encapsulant 120 may be applied and thinned to expose the first through vias 116 (although the encapsulant 120 may remain over the first IPD dies 50A and 50B since there are no electrical connections to be made to this side), the front-side redistribution structure 122 may be formed to make electrical connection with the first through vias 116, the second IPD dies 50C and 50D will be bonded to the front-side redistribution structure 122, and the encapsulant 136 may be applied to encapsulate the second IPD dies 50C and 50D to form the first IPD stack 500. Additionally, the first IPD stack 500 may be placed onto the third redistribution structure 138 along with the first functional die 60A and the second functional die 60B, the encapsulant 146 may be applied, and the structure may be connected to the substrate 150.

Figure 9A:
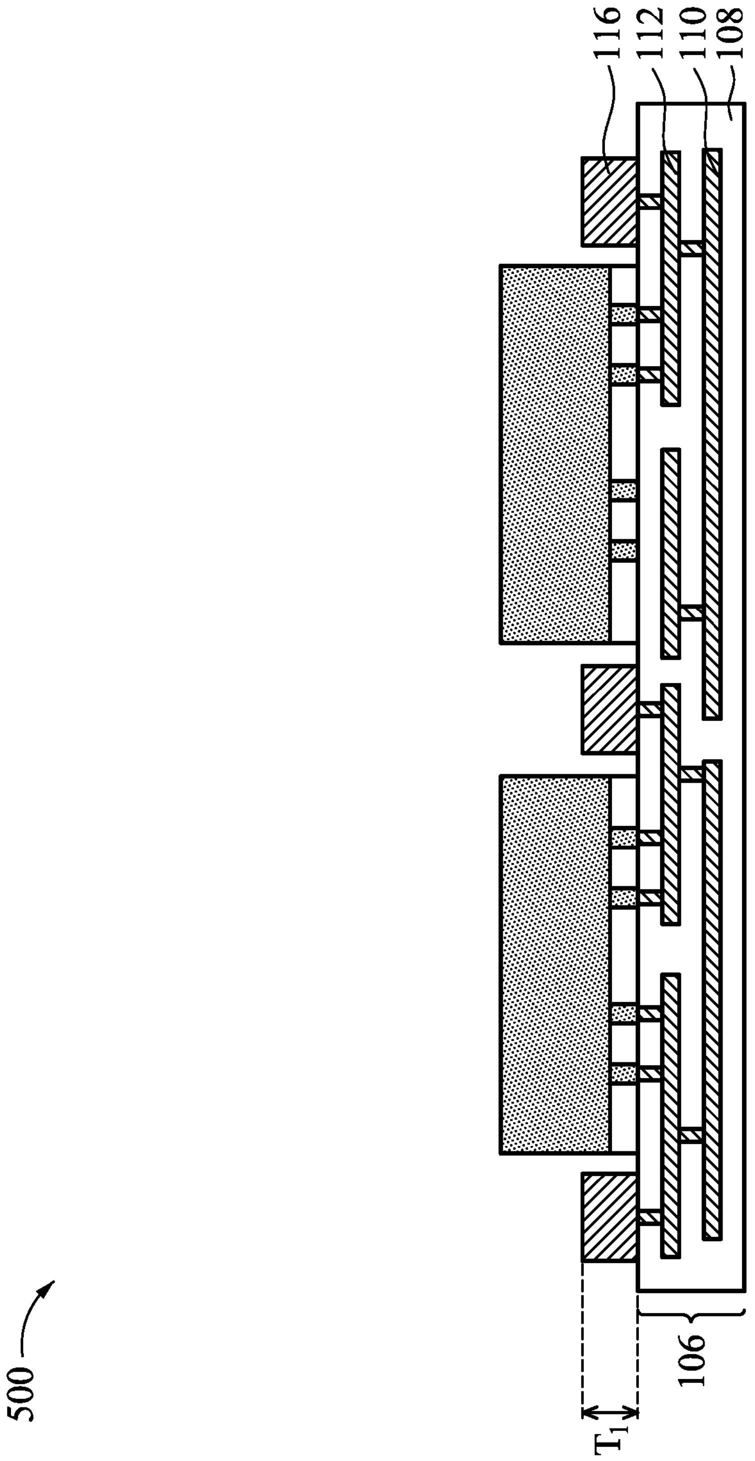
FIGS. 9A-9C illustrate a multi-connection through via, in accordance with some embodiments.
Figure 9B:
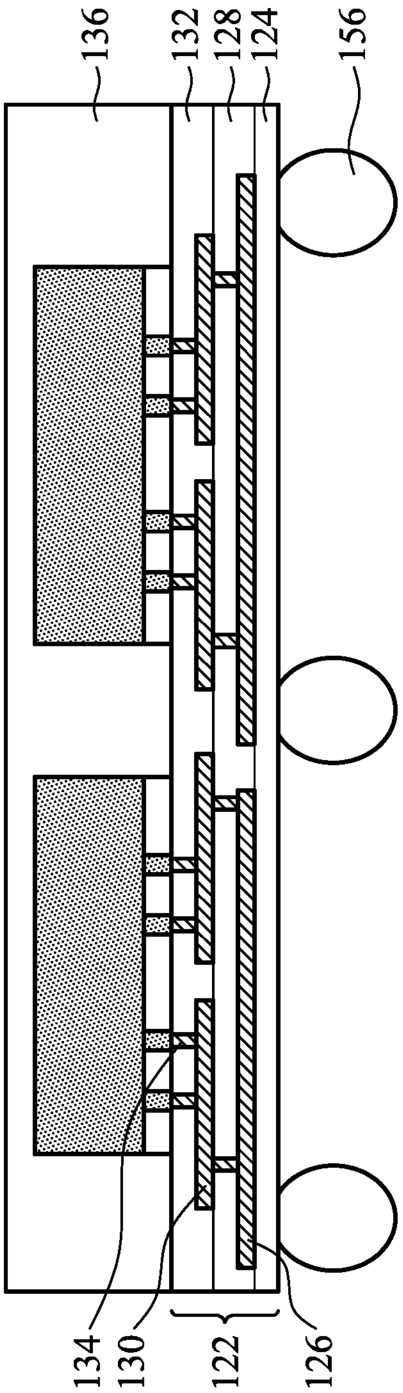
Figure 9C:
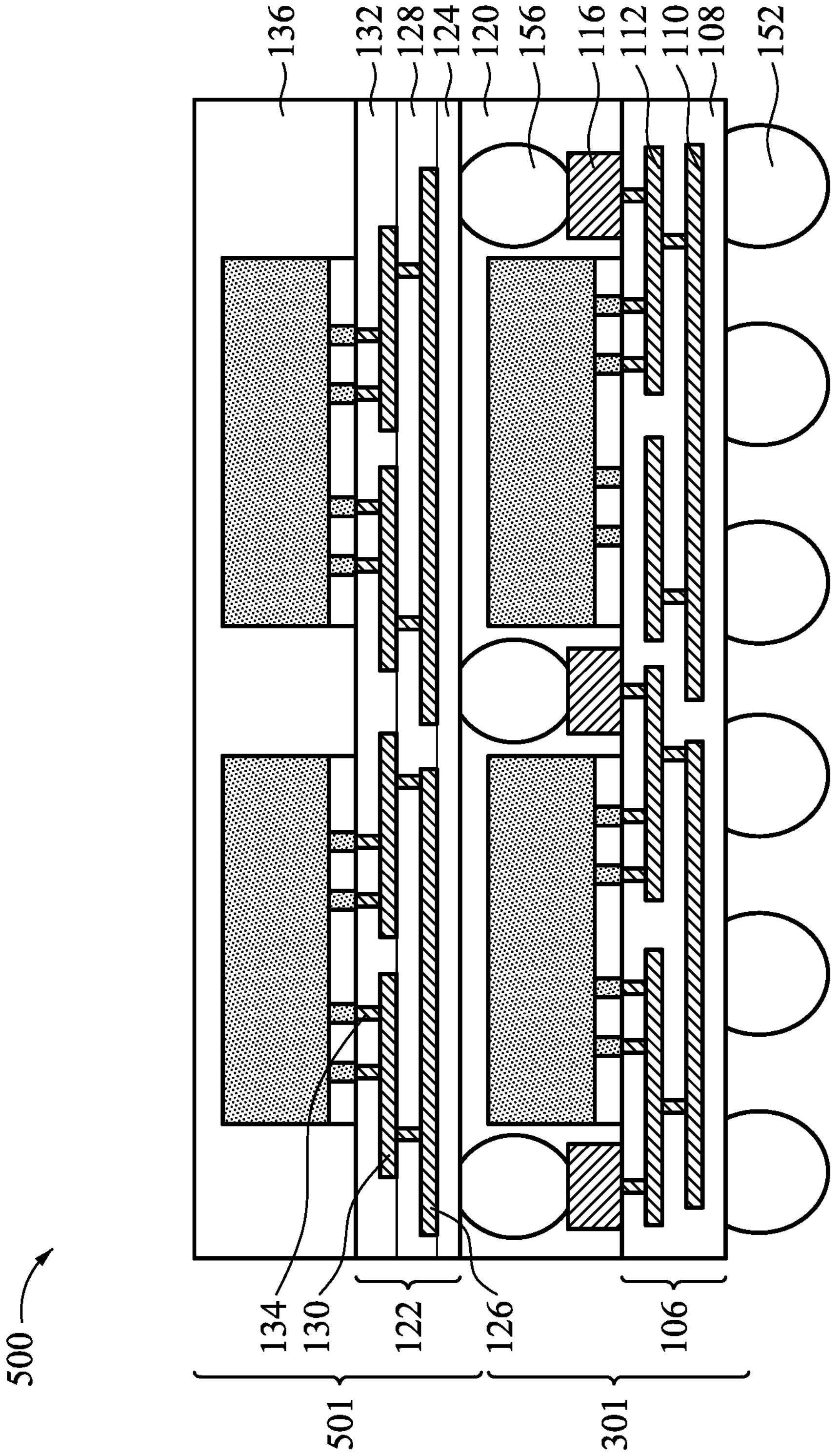

FIGS. 9A-9C illustrate another embodiment in which the first IPD stack 500 is formed with second external connectors 156 in addition to the first through vias 116 to connect the back-side redistribution structure 106 and the front-side redistribution structure 122. In this embodiment, as illustrated in FIG. 9A, the back-side redistribution structure 106 is formed as described above with respect to FIG. 1. For example, the dielectric layer 108 is formed over the carrier substrate 102 (not separately illustrated in FIG. 9A) and the one or more metallization patterns 110 are formed over the dielectric layer 108 to form the back-side redistribution structure 106.

Once the back-side redistribution structure 106 has been formed, the first through vias 116 may be formed in electrical connection with the back-side redistribution structure 106. In an embodiment the back-side redistribution structure 106 may be formed as described above with respect to FIG. 2A. For example, a seed layer is formed, a photoresist is placed and patterned over the seed layer, the materials of the first through vias 116 are plated into the openings of the photoresist, the photoresist is removed, and uncovered portions of the seed layer are removed. However, any suitable methods and materials may be utilized to form the first through vias 116.

In this embodiment, however, the first through vias 116 are not intended to be the sole connection between the back-side redistribution structure 106 and the front-side redistribution structure 122. As such, the first through vias 116 do not need to be as tall as the first IPD dies 50A and 50B, and are formed to have a smaller height than the first IPD dies 50A and 50B. For example, in this embodiment the first through vias 116 may be formed to have a first thickness Ti of between about 10 μm and about 650 μm, such as about 50 μm. However, any suitable thickness may be utilized.

FIG. 9B illustrates a formation of the front-side redistribution structure 122. In this embodiment, however, instead of forming the front-side redistribution structure 122 on the encapsulant 120, the front-side redistribution structure 122 is separately from the back-side redistribution structure 106, such as by being formed on a second carrier wafer (not separately illustrated) similar to the carrier substrate 102. For example, the dielectric layer 124 will be formed over the second carrier wafer and an release layer 104, and the one or more metallization pattern 126 are formed over the dielectric layer 124.

FIG. 9B additionally illustrates that, once the front-side redistribution structure 122 is formed, the second IPD dies 50C and 50D are bonded to the front-side redistribution structure 122. In an embodiment the second IPD dies 50C and 50D are bonded as described above with respect to FIG. 5A. For example, the second IPD dies 50C and 50D are placed with a pick and place process, and the second IPD dies 50C and 50D are bonded using, e.g., a hybrid bonding process. However, any suitable method of bonding the second IPD dies 50C and 50D may be utilized.

Further, once the second IPD dies 50C and 50D are bonded to the front-side redistribution structure 122, the second IPD dies 50C and 50D are encapsulated with the encapsulant 136. In an embodiment the encapsulant 136 may be applied as described above with respect to FIG. 5A. However, any suitable encapsulation may be utilized.

Finally, FIG. 9B illustrates the placement of second external connectors 156 in electrical connection with the front-side redistribution structure 122, wherein the second external connectors 156 are used in conjunction with the first through vias 116 to connect the back-side redistribution structure 106 with the front-side redistribution structure 122. In an embodiment the placement of the second external connectors 156 may be initiated by first removing the second carrier wafer and adhesive layer to expose the dielectric layer 124 of the front-side redistribution structure 122. In an embodiment the second carrier wafer may be removed as described above with respect to the first carrier wafer, although any suitable removal process may be utilized.

Once the dielectric layer 124 has been exposed, the dielectric layer 124 may be patterned in order to expose portions of the one or more metallization pattern 126. In an embodiment the dielectric layer 124 may be patterned using, e.g., a laser drilling method. In such a method a protective layer, such as a light-to-heat conversion (LTHC) layer or a hogomax layer (not separately illustrated in FIG. 9B) is first deposited over the dielectric layer 124. Once protected, a laser is directed towards those portions of the dielectric layer 124 which are desired to be removed. During the laser drilling process the drill energy may be in a range from 0.1 mJ to about 30 mJ, and a drill angle of about 0 degree to about 85 degrees to normal of the dielectric layer 124.

However, any suitable method, such as a photolithographic masking and etching process, may also be utilized.

Once the dielectric layer 124 has been patterned, the second external connectors 156 are placed through the dielectric layer 124 and in electrical connection with the front-side redistribution structure 122. The second external connectors 156 may be contact bumps such as microbumps or controlled collapse chip connection (C4) bumps and may comprise a material such as tin, or other suitable materials, such as silver or copper. In an embodiment in which the second external connectors 156 are tin solder bumps, the second external connectors 156 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape FIG. 9C illustrates a bonding of the second external connectors 156 to the first through vias 116, thereby electrically connecting the back-side redistribution structure 106 and the front-side redistribution structure 122. In an embodiment, once the second external connectors 156 have been formed, the second external connectors 156 are aligned with and placed into physical contact with the first through vias 116, and a bonding is performed. For example, in an embodiment in which the second external connectors 156 are solder bumps, the bonding process may comprise a reflow process whereby the temperature of the second external connectors 156 is raised to a point where the second external connectors 156 will liquefy and flow, thereby bonding the second external connectors 156 to the first through vias 116 once the second external connectors 156 resolidifies. However, any suitable bonding process may be utilized.

FIG. 9C also illustrates that, once the second external connectors 156 have been bonded to the first through vias 116, the encapsulant 120 may be placed around the second external connectors 156, the first through vias 116, and the first IPD dies 50A and 50B in order to provide additional support between the back-side redistribution structure 106 and the front-side redistribution structure 122. In an embodiment the encapsulant 120 may be placed as described above with respect to FIG. 3. For example, the encapsulant 120 may be applied by compression molding, transfer molding, or the like. However, any suitable method of applying the encapsulant 120 between the back-side redistribution structure 106 and the front-side redistribution structure 122 may be utilized.

In another embodiment, the encapsulant 120 may be an underfill material. In this embodiment the encapsulant 120 may be formed by a capillary flow process after the second external connectors 156 have been bonded to the first through vias 116. However, any suitable method and material may be utilized.

Once the first IPD stack 500 has been formed in this embodiment, the process can be continued as described above with respect to FIGS. 6-8. For example, the first IPD stack 500 may be placed onto the third redistribution structure 138 along with the first functional die 60A and the second functional die 60B, the encapsulant 146 may be applied, and the structure may be connected to the substrate 150. However, any suitable methods may be utilized to connect the first IPD stack 500 to other structures.

Figure 10A:
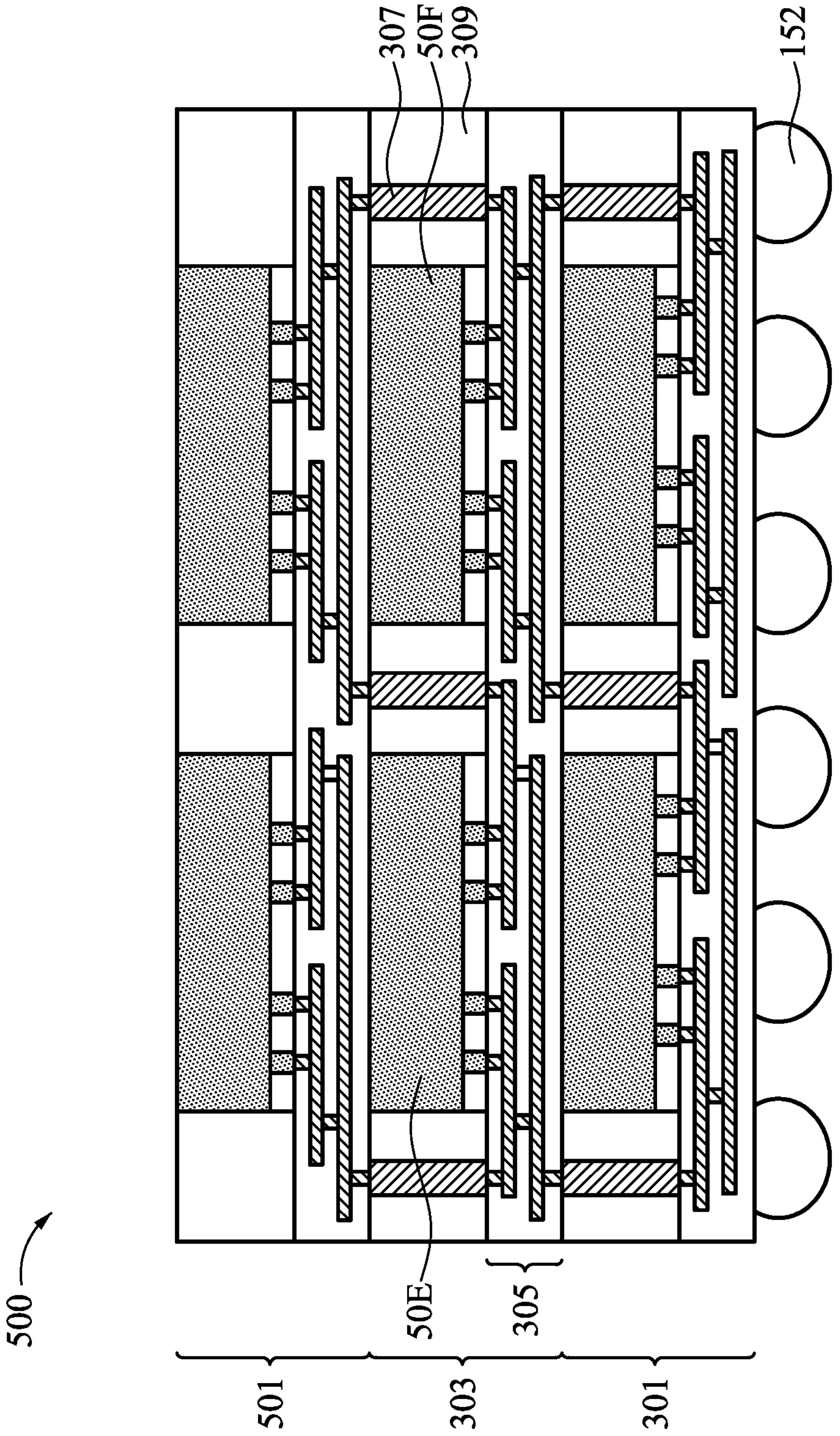
FIGS. 10A-10B illustrate a three layer integrated passive device stack in accordance with some embodiments.

FIG. 10A illustrates yet another embodiment in which the first IPD stack 500 is formed with more layers than just the first bottom layer 301 and the first top layer 501. In the embodiment illustrated in FIG. 10A, the first bottom layer 301 is formed as described above with respect to FIGS. 1-8 (with the illustrated embodiment being in a face-to-back configuration, although any of the disclosed configurations may be utilized).

Once the first bottom layer 301 is formed, a first middle layer 303 is formed over the first bottom layer 301 prior to formation of the first top layer 501. In an embodiment the first middle layer 303 comprises a fourth redistribution layer 305, second through vias 307, third IPD dies 50E and 50F, and a third encapsulant 309. In an embodiment the fourth redistribution layer 305 is formed using similar methods and materials as the front-side redistribution structure 122, described above with respect to FIG. 4. For example, a series of dielectric layers and metallization layers are alternatingly deposited to build up the fourth redistribution layer 305. However, any suitable methods and materials may be utilized.

Once the fourth redistribution layer 305 is formed, the second through vias 307 are formed in electrical connection with the fourth redistribution layer 305. In an embodiment the second through vias 307 may be formed using similar methods and materials as the first through vias 116 as described above with respect to FIG. 2A. For example, a seed layer is deposited over the fourth redistribution layer 305, a photoresist is placed and patterned over the seed layer, the second through vias 307 are formed within the pattern of the photoresist, the photoresist is removed, and the uncovered portions of the seed layer are removed. However, any suitable methods and materials may be utilized.

Additionally, once the second through vias 307 have been formed, the third IPD dies 50E and 50F may be placed adjacent to the second through vias 307. In an embodiment the third IPD dies 50E and 50F may be similar to the first IPD dies 50A and 50B (e.g., may be capacitor dies) and may be placed in physical and electrical contact with the fourth redistribution layer 305 using, e.g., a pick and place process. Once in physical contact, the third IPD dies 50E and 50F may be bonded using, e.g., a hybrid bonding process, a metal-to-metal bonding process, a dielectric bonding process, combinations of these, or the like. However, any suitable processes may be utilized.

FIG. 10A also illustrates that once the third IPD dies 50E and 50F have been bonded, a third encapsulant 309 may be placed over the third IPD dies 50E and 50F and thinned to expose the second through vias 307. In an embodiment the third encapsulant 309 may be deposited using similar materials and methods as the encapsulant 120 as described above with respect to FIG. 3. However, any suitable methods and materials may be utilized.

Once the first middle layer 303 has been formed, the first top layer 501 may be formed over the first middle layer 303 and the conductive connectors 152 are placed in connection with the first bottom layer 301. In an embodiment the first top layer 501 may be formed as described above with respect to FIGS. 4-5. For example, the front-side redistribution structure 122 is formed, the second IPD dies 50C and 50D are placed and bonded to the front-side redistribution structure 122, and the encapsulant 136 is utilized to encapsulate the second IPD dies 50C and 50D. Similarly, the conductive connectors 152 may be placed as described above with respect to FIG. 5A. However, any suitable methods and materials may be utilized to form and/or place the first top layer 501 and the conductive connectors 152.

Figure 10B:
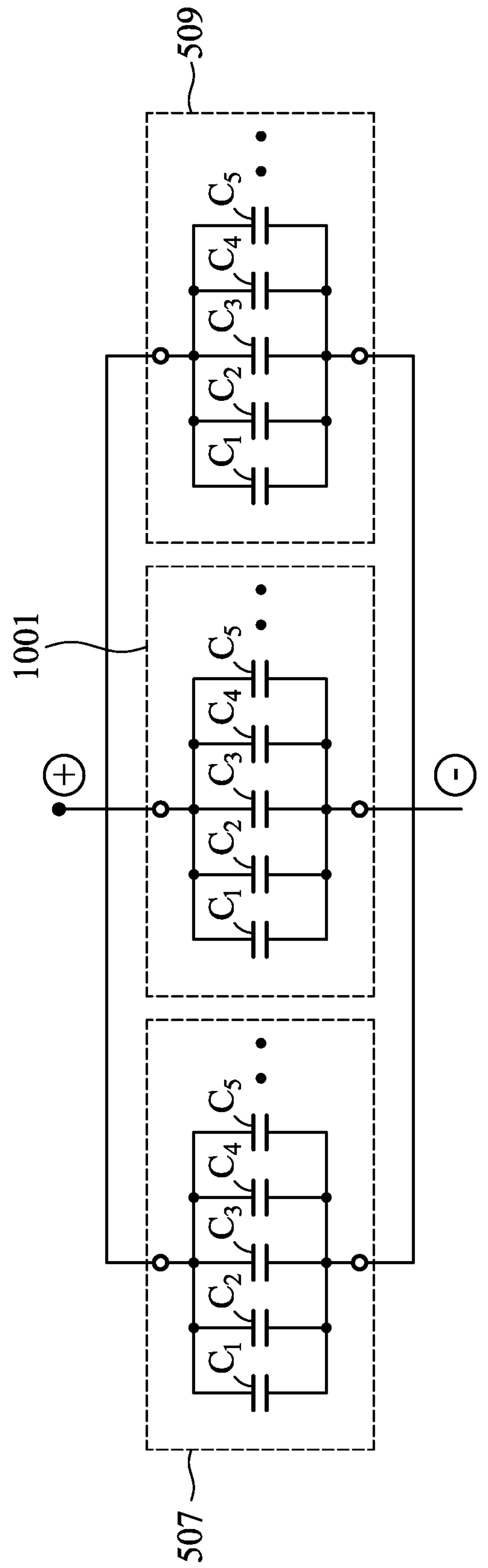

FIG. 10B illustrates an equivalent circuit which represents the equivalent capacitance that can be achieved with the first IPD stack 500 and three layers. In this embodiment, the capacitance ($C_a$) that is obtainable from the first bottom layer 301 is represented in the dashed box 507 (wherein the individual capacitances of the individual capacitors are labeled $C_1$, $C_2$, etc. . . . ); the capacitance ($C_b$) that is obtainable from the first top layer 501 is represented in the dashed box 509 (wherein the individual capacitances of the individual capacitors are labeled $C_1$, $C_2$, etc. . . . ); and the capacitance ($C_c$) that is obtainable from the first middle layer 303 is represented in the dashed box 1001 (wherein the individual capacitances of the individual capacitors are labeled $C_1$, $C_2$, etc. . . . ). As can be seen, by stacking and interconnecting each of the IPD dies in the first IPD stack 500 (e.g., the first IPD dies 50A and 50B; the second IPD dies 50C and 50D; and the third IPD dies 50E and 50F), the IPD dies can be interconnected in a parallel arrangement. As such, the total capacitance ($C_T$) for the first IPD stack 500 can be the sum of the capacitance ($C_a$) that is obtainable from the first bottom layer 301; the capacitance ($C_b$) that is obtainable from the first top layer 501; and the capacitance ($C_c$) that is obtainable from the first middle layer 303 (e.g., $C_T=C_a+C_b+C_c$). As such, a larger capacitance can be obtained without increasing the overall footprint and the capacitance can be scaled as desired simply by increasing or decreasing the number of layers or the number of IPD dies within each layer.

Figure 11:
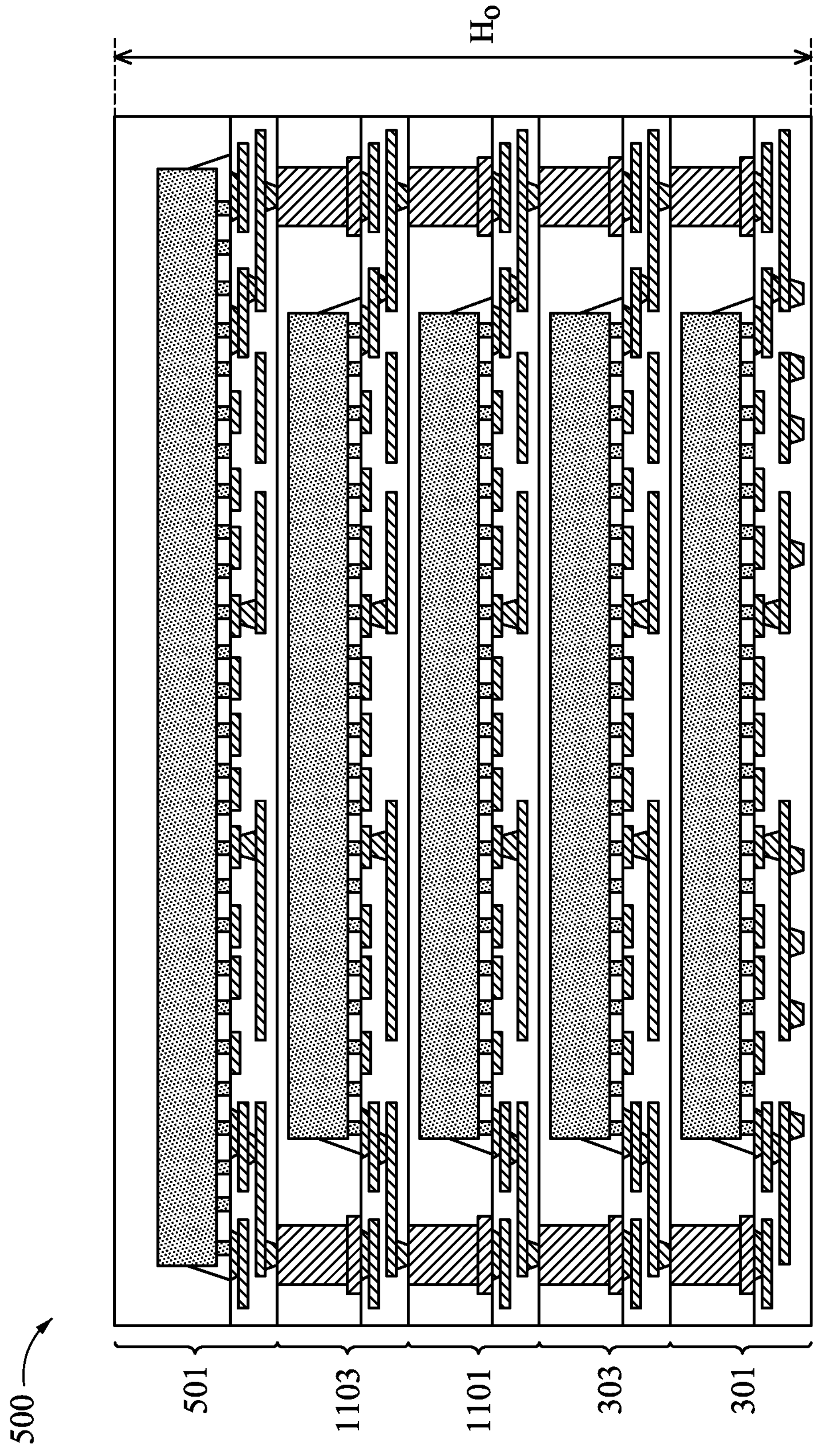
FIG. 11 illustrates a five layer integrated passive device stack in accordance with some embodiments.

FIG. 11 illustrates yet another embodiment in which five layers are utilized within the first IPD stack 500. For example, in this embodiment the first bottom layer 301, the first middle layer 303 and the first top layer 501 are formed as described herein, but with only a single one of the IPD dies in each layer. Additionally, in this embodiment, there is formed a second middle layer 1101 and a third middle layer 1103, which may be similar to the first middle layer 303 as described above with respect to FIG. 10A (but with a single one of the IPD dies). However, any suitable number of layers may be utilized.

In this embodiment, the overall first IPD stack 500 with five layers may have an overall height $H_o$ of 670 μm (e.g., 100 μm per IPD die plus 30 μm per redistribution layer and molding compound on either side of four of the IPD dies, and plus 50 μm for the redistribution layer and molding compound on either side of the first top layer 501). Additionally, in embodiments in which the individual IPD dies may each have a capacitance of 1.1 $\mu F/mm^2$ and the IPD dies have an active area of 32.27 $mm^2$, then each of the individual layers may have a single layer capacitance of 35.5 μF. As such, the overall capacitance of the first IPD stack 500 in this particular embodiment is about 178 μF. However, any suitable parameters may be utilized.

Figure 12:
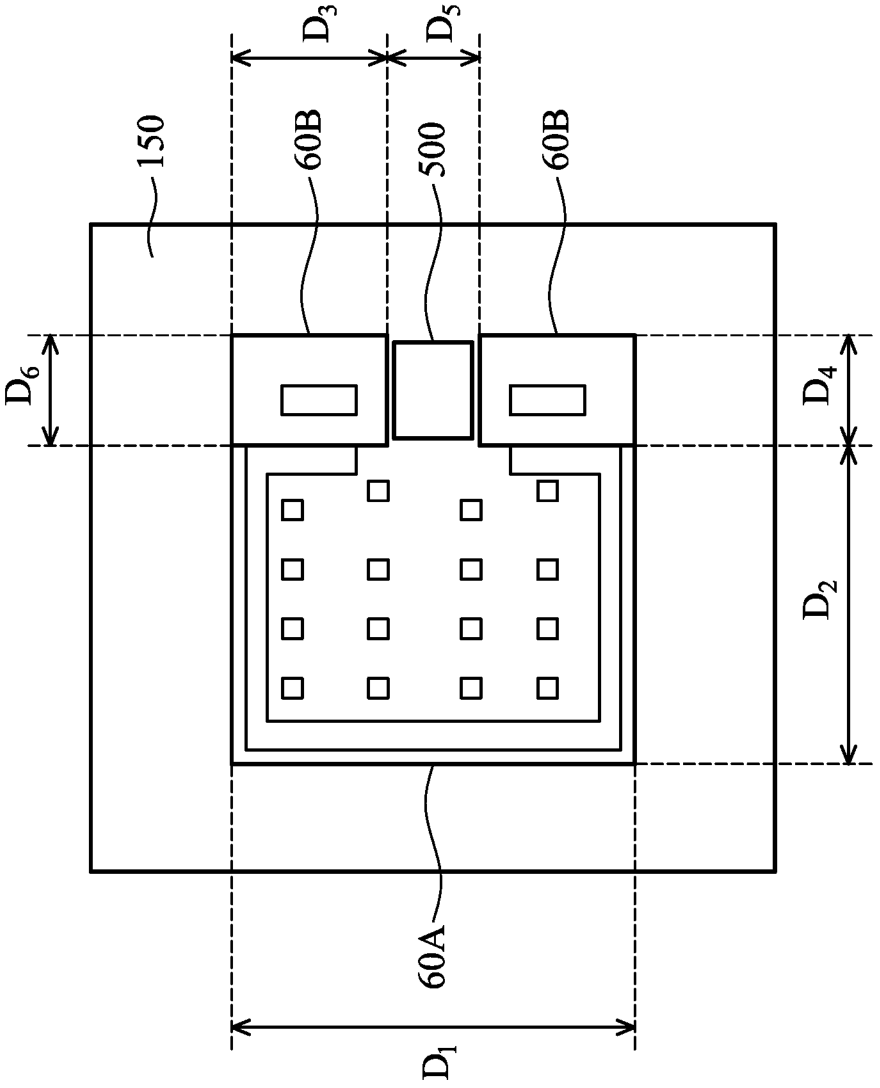
FIG. 12 illustrates a top down view of the integrated passive device stack in accordance with some embodiments.

FIG. 12 illustrates a top down version of one possible layout with the first packaged structure and the substrate 150. In the illustrated embodiment the first IPD stack 500 is placed onto the substrate 150 between a first one of the second functional dies 60B and a second one of the second functional dies 60B (e.g. between two high bandwidth memory dies). Additionally, one of the first functional dies 60A (e.g., a system on chip die) is connected to the substrate 150 adjacent to each of the first one of the second functional dies 60B, the second one of the second functional dies 60B, and the first IPD stack 500. However, any suitable layout may be utilized.

In an embodiment the first functional die 60A may have a first dimension $D_1$ of between about 10 mm and about 100 mm, such as about 33 mm, and a second dimension $D_2$ of between about 8 mm and about 95 mm, such as about 25 mm. Similarly, each of the second functional dies 60B may have a third dimension $D_3$ of between about 3 mm and about 20 mm, such as about 12 mm, and a fourth dimension $D_4$ of between about 2 mm and about 20 mm, such as about 8 mm. However, any suitable dimensions may be utilized.

With respect to the first IPD stack 500, the first IPD stack 500 may be formed to have dimensions that fit within the small footprint left by the first functional die 60A and the second functional dies 60B. As such, the first IPD stack 500 may have a fifth dimension $D_5$ of between about 2 mm and about 20 mm, such as about 8 mm, while having a sixth dimension $D_6$ of between about 2 mm and about 20 mm, such as about 8 mm. However, any suitable dimensions may be utilized.

By packaging multiple IPD dies within a package utilizing the first IPD stack 500, a larger parameter (e.g., a larger capacitance) can be obtained without also requiring a larger footprint. Further, the desire capacitance can be precisely tuned using both a desired number of layers as well as a desired number and/or size of IPD dies. As such, any desired capacitance can be achieved without sacrificing size.

In accordance with an embodiment, a semiconductor device includes: a first integrated passive device (IPD); a first molding compound encapsulating the first IPD; a redistribution structure over and electrically connected to the first IPD; a second IPD on an opposing side of the redistribution structure as the first IPD, wherein the second IPD is electrically connected to the first IPD by the redistribution structure; and a second molding compound encapsulating the second IPD. In an embodiment a face of the first IPD faces a face of the second IPD. In an embodiment a face of the first IPD faces a back of the second IPD. In an embodiment the semiconductor device further includes a conductive via extending through the first molding compound. In an embodiment the semiconductor device further includes a conductive feature extending through the first molding compound, the conductive feature includes: a conductive via; and a solder region on the conductive via. In an embodiment the first IPD is electrically connected to the redistribution structure by a copper pillar. In an embodiment the first IPD is electrically connected to the redistribution structure by a solder region.

In accordance with another embodiment, a semiconductor device includes: a first redistribution structure; a first functional die bonded to the first redistribution structure; and a first integrated passive device stack bonded to the first redistribution structure, the first integrated passive device stack includes: a second redistribution structure; a first integrated passive device over the second redistribution structure; a third redistribution structure over the first integrated passive device, the third redistribution structure being connected to the second redistribution structure by first through vias; and a second integrated passive device over the third redistribution structure. In an embodiment the semiconductor device further includes: a third integrated passive device between the second redistribution structure and the third redistribution structure; and a first encapsulant surrounding the third integrated passive device and the first integrated passive device. In an embodiment the first through vias comprise copper pillars. In an embodiment the first through vias includes: copper pillars; and solder balls in physical contact with the copper pillars. In an embodiment the first integrated passive device and the second integrated passive device are configured in a face-to-face configuration. In an embodiment the first integrated passive device and the second integrated passive device are configured in a back-to-face configuration. In an embodiment the first integrated passive device stack further includes: a fourth redistribution structure over the second integrated passive device, the fourth redistribution structure being connected to the third redistribution structure by second through vias; and a third integrated passive device over the fourth redistribution structure.

In accordance with yet another embodiment, a method of manufacturing a semiconductor device, the method includes: forming a first redistribution structure over a carrier wafer; forming through vias over the first redistribution structure; placing a first integrated passive device on the first redistribution structure adjacent to the through vias; encapsulating the first integrated passive device and the through vias with an encapsulant; forming a second redistribution structure over the encapsulant and in electrical connection with the through vias; and placing a second integrated passive device on the second redistribution structure and in electrical connection with the through vias. In an embodiment the placing the first integrated passive device on the first redistribution structure places the first integrated passive device in electrical connection with the first redistribution structure. In an embodiment the placing the first integrated passive device on the first redistribution structure utilizes an adhesive. In an embodiment the placing the first integrated passive device places a integrated passive capacitor. In an embodiment the method further includes bonding the first redistribution structure to a third redistribution layer. In an embodiment the method further includes: bonding a first functional die to the third redistribution layer; and encapsulating the first functional die in an encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

forming a redistribution layer;

after the forming the redistribution layer, bonding a first integrated passive device (IPD) and a second integrated passive device to the redistribution layer;

encapsulating the first IPD with a first molding compound, wherein during the encapsulating, the first molding compound comes into contact with both the first IPD and the redistribution layer in physical contact with an adhesive, the adhesive in physical contact with the first IPD;

planarizing the first molding compound with external contacts of the first IPD;

forming a redistribution structure over and electrically connected to the external contacts of the first IPD, wherein during the forming the redistribution structure, the first molding compound is planar with the external contacts;

placing a third IPD on an opposing side of the redistribution structure as the first IPD, wherein the third IPD is electrically connected to a through via extending through the first molding compound, wherein capacitors within the first IPD and the third IPD are interconnected in a parallel arrangement;

encapsulating the third IPD with a second molding compound to form a first integrated passive device stack;

bonding the first integrated passive device stack to a third redistribution structure using a plurality of external connections, wherein the plurality of external connections comprises parallel lines of ground connections and power connections; and bonding a first functional die to the third redistribution structure.

2. The method of claim 1, wherein the encapsulating the first IPD encapsulates the through via.

3. The method of claim 2, wherein the encapsulating the first IPD encapsulates a fourth IPD adjacent to the first IPD.

4. The method of claim 1, further comprising placing a fourth IPD on the opposing side of the redistribution structure as the first IPD, wherein the encapsulating the third IPD encapsulates the fourth IPD.

5. The method of claim 1, further comprising, after the encapsulating the third IPD, bonding the redistribution layer to a second redistribution layer.

6. The method of claim 5, further comprising bonding a first functional die to the second redistribution layer.

7. The method of claim 6, further comprising bonding a second functional die to the second redistribution layer.

8. A method of manufacturing a semiconductor device, the method comprising:

forming a first redistribution layer;

after the forming the first redistribution layer, bonding a first integrated passive device and a second integrated passive device to the first redistribution layer;

planarizing an encapsulant with external die contacts of the first integrated passive device;

forming a second redistribution layer over the first integrated passive device while the encapsulant is planar with the external die contacts;

bonding a third integrated passive device to the second redistribution layer to form a first integrated passive device stack, wherein capacitors within the first integrated passive device and the third integrated passive device are interconnected in a parallel arrangement, wherein the third integrated passive device is a more advanced process node than the first integrated passive device;

bonding the first integrated passive device stack to a third redistribution structure using a plurality of external connections, wherein the plurality of external connections comprises parallel lines of ground connections and power connections; and bonding a first functional die to the third redistribution structure.

9. The method of claim 8, wherein the bonding the third integrated passive device bonds the third integrated passive device and the first integrated passive device in a face-to-face configuration.

10. The method of claim 8, wherein the bonding the third integrated passive device bonds the third integrated passive device and the first integrated passive device in a back-to-face configuration.

11. The method of claim 8, further comprising encapsulating the third integrated passive device.

12. The method of claim 8, further comprising forming through vias on the first redistribution layer prior to the planarizing the encapsulant.

13. The method of claim 12, further comprising placing a microbump on the through via.

14. The method of claim 13, wherein the placing the microbump is performed prior to the encapsulating the planarizing the encapsulant.

15. A method of manufacturing a semiconductor device, the method comprising:

forming a first redistribution structure over a carrier wafer;

after the forming the first redistribution structure, forming through vias over the first redistribution structure;

after the forming the first redistribution structure, bonding a first integrated passive device and a second integrated passive device on the first redistribution structure adjacent to the through vias, wherein the first integrated passive device and the second integrated passive device are devices from different process nodes, the first integrated passive device being a more advanced process node than the second integrated passive device, wherein after the bonding the first integrated passive device, external die contacts of the first integrated passive device face away from the first redistribution structure;

encapsulating the first integrated passive device and the through vias with an encapsulant;

planarizing the encapsulant with external die contacts of the first integrated passive device;

forming a second redistribution structure over the encapsulant and in electrical connection with the through vias while the encapsulant is planar with the external die contacts;

fusion bonding a third integrated passive device to the second redistribution structure and in electrical connection with the through vias to form a first integrated passive device stack, wherein capacitors within the first integrated passive device and the third integrated passive device are interconnected in a parallel arrangement;

bonding the first integrated passive device stack to a third redistribution structure using a plurality of external connections, wherein the plurality of external connections comprises parallel lines of ground connections and power connections; and bonding a first functional die to the third redistribution structure.

16. The method of claim 15, wherein the bonding the first integrated passive device on the first redistribution structure utilizes an adhesive.

17. The method of claim 15, wherein the bonding the first integrated passive device places an integrated passive capacitor.

18. The method of claim 15, wherein the bonding the first integrated passive device stack uses a reflow process.

19. The method of claim 15, further comprising encapsulating the first functional die in a second encapsulant.

20. The method of claim 15, wherein the bonding the first functional die bonds a system on chip device.

* * * * *